(12) United States Patent
Cheng et al.

(10) Patent No.: US 11,444,124 B2
(45) Date of Patent: Sep. 13, 2022

(54) HYBRID MEMRISTOR/FIELD-EFFECT TRANSISTOR MEMORY CELL AND ITS INFORMATION ENCODING SCHEME

(71) Applicant: The Hong Kong University of Science and Technology, Hong Kong (CN)

(72) Inventors: Kwang Ting Cheng, Hong Kong (CN); Miguel Angel Lastras Montaño, Goleta, CA (US)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 349 days.

(21) Appl. No.: 16/630,195

(22) PCT Filed: Jul. 11, 2018

(86) PCT No.: PCT/CN2018/095297
§ 371 (c)(1),
(2) Date: Jan. 10, 2020

(87) PCT Pub. No.: WO2019/019920
PCT Pub. Date: Jan. 31, 2019

(65) Prior Publication Data
US 2020/0161373 A1    May 21, 2020

Related U.S. Application Data

(60) Provisional application No. 62/604,905, filed on Jul. 26, 2017.

(51) Int. Cl.
*H01L 27/24* (2006.01)
*G11C 13/00* (2006.01)

(52) U.S. Cl.
CPC ........ *H01L 27/2472* (2013.01); *G11C 13/004* (2013.01); *G11C 13/0026* (2013.01);
(Continued)

(58) Field of Classification Search
CPC ............ H01L 27/2472; H01L 27/2409; H01L 27/2454; H01L 27/2463; H01L 27/2436;
(Continued)

(56) References Cited

U.S. PATENT DOCUMENTS 3,761,896 A    9/1973  Davidson
9,514,810 B1   12/2016 Sadd et al.
(Continued)

FOREIGN PATENT DOCUMENTS

CN    101194320 A    6/2008
CN    103247338 A    8/2013
(Continued)

OTHER PUBLICATIONS

State Intellectual Property Office of the P.R. China, International Search Report in International Application No. PCT/CN2018/095297 (dated Nov. 14, 2018).
(Continued)

*Primary Examiner* — Dao H Nguyen
(74) *Attorney, Agent, or Firm* — Leydig, Voit & Mayer, Ltd.

(57) ABSTRACT

A resistive random-access memory (ReRAM) includes a hybrid memory cell. The hybrid memory cell includes: (a) a left resistance-switching device comprising a first terminal and a second terminal, (b) a right resistance-switching device comprising a first terminal and a second terminal, wherein the first terminal of the right resistance-switching device is connected to the first terminal of the left-resistive switching device at an internal node, and (c) a transistor comprising a source terminal, a drain terminal, and a gate terminal, wherein the drain terminal of the transistor is connected to the left resistance-switching device and the right resistance-switching device at the internal node.

20 Claims, 10 Drawing Sheets

(52) U.S. Cl.
CPC ...... *G11C 13/0028* (2013.01); *G11C 13/0069* (2013.01); *H01L 27/2409* (2013.01); *H01L 27/2454* (2013.01)

(58) Field of Classification Search
CPC ............ G11C 13/0026; G11C 13/0028; G11C 13/004; G11C 13/0069
USPC .......................................................... 257/4
See application file for complete search history.

(56) References Cited

U.S. PATENT DOCUMENTS

| | | | |
|---|---|---|---|
| 9,847,132 B1* | 12/2017 | Zheng | G11C 13/0069 |
| 2006/0139991 A1 | 6/2006 | Aoki | |
| 2013/0181180 A1 | 7/2013 | Tada et al. | |
| 2014/0029328 A1* | 1/2014 | Ribeiro | G11C 14/009 365/148 |
| 2014/0269006 A1* | 9/2014 | Sekar | G11C 13/0002 365/148 |
| 2015/0357032 A1* | 12/2015 | Tatsu | G11C 13/003 365/72 |
| 2016/0118116 A1 | 4/2016 | Sekar et al. | |
| 2018/0006088 A1* | 1/2018 | Sheng | H01L 45/1253 |
| 2019/0028101 A1* | 1/2019 | Nebashi | G11C 13/0023 |

FOREIGN PATENT DOCUMENTS

| | | |
|---|---|---|
| CN | 106409335 A | 2/2017 |
| JP | 2017-037689 A | 2/2017 |
| WO | 2005/066969 A1 | 7/2005 |
| WO | 2016/117134 A1 | 7/2016 |

OTHER PUBLICATIONS

Jo, Sung Hyun, et al., "3D-stackable Crossbar Resistive Memory based on Field Assisted Superlinear Threshold (FAST) Selector", In Electron Devices Meeting (IEDM), IEEE International, pp. 6.7.1-6.7.4, (2014).
Kim, Kuk-Hwan, et al., "A Functional Hybrid Memristor Crossbar-Array/CMOS System for Data Storage and Neuromorphic Applications", Nano Letters, vol. 12(1), Nano Letters, pp. 389-395, (2012).
Lastras-Montano, Miguel Angel, et al., "A Low-Power Hybrid Reconfigurable Architecture for Resistive Random-Access Memories", International Symposium High Performance Computer-Architecture (HPCA), IEEE on, pp. 102-113, (2016).
Mielke, Neal, et al., "Bit Error Rate in NAND Flash Memories", IEEE 46$^{th}$ Annual International Reliability Physics Symposium, pp. 9-19, Phoenix, (2008).
Linn, Eike, et al. "Complementary resistive switches for passive nanocrossbar memories", Nature Materials, 9(5), pp. 403-406, 92010).
Kund, Michael, et al., "Conductive bridging RAM (CBRAM) An emerging non-volatile memory technology scalable to sub 20nm", In Electron Devices Meeting (IDEM), IEEE International, pp. 754-757, (2005).
Jeong, Doo Seok, et al., "Electroforming Processes in Metal Oxide Resistive Switching Cells", Resistive Switching: From Fundamental of Nanoionic Redox Processes to Memristive Device Applications, pp. 289-316, (2016).
Lee, H.Y., et al., "Evidence and Solution of Over-RESET Problem for HfO$_x$ Based Resistive Memory with Sub-ns Switching Speed and High Endurance" In electron Devices Meeting (IEDM), IEEE International, pp. 19.7.1-19.7.4, (2010).
Park, Jong-Man, et al., "Fully Integrated Advanced Bulk FinFETs Architecture Featuring Partially-Insulating Technigue for DRAM Cell Application of 40nm Generation and Beyond", In Electron Devices Meeting (IEDM), IEEE International, pp. 1-4, (2006).
Lin, C.H., et al., "High Performance 14nm SOI FinFET CMOS Technology with 0.0174μm$^2$ embedded DRAM and 15 Levels of Cu Metallization", In Electron Devices Meeting, (IEDM), IEEE International, pp. 3.8.1-3.8.3, (2014).

Zhao, L., et al., "Multi-level control of conductive nano-filament evolution in HfO$_2$ ReRAM by pulse-train operations", Nanoscale, vol. 6, pp. 5698-5702, (2014).
Merced-Grafals, Emmanuelle J., et al., "Repeatable, accurate, and high Speed multi-level programming of memristor 1T1R arrays for power efficient analog computing applications", Nanotechnology, 27(36), pp. 1-9, (2016).
Terai, M., et al., "Resistance Controllability of Ta$_2$O$_5$/TiO$_2$ Stack ReRAM for Low-Voltage and Multilevel Operation", IEEE Electron Device Letters, 31(3), pp. 204-206, (Mar. 2010).
Maikap, Siddheswar, et al., "Self-compliance RRAM characteristics using a novel W/TaOx/TiN structure", Nanoscale Research Letters, 9(1), pp. 2-6, (2014).
Kim, Kinam, "Technology for sub-50nm DRAM and NAND Flash Manufacturing", In Electron Devices Meeting, (IEDM), IEEE International, pp. 323-326, (2005).
Strukov, Dmitri B., et al., "The missing memristor found", Nature, vol. 453(7191), pp. 80-83, (2008).
Kim, Kyung Min, et al., "Voltage divider effect for the improvement of variability and endurance of TaO$_x$ memristor", Scientific Reports, vol. 6, pp. 1-6, (2016).
Huang et al., "High-Density and High-Reliability Nonvolatile Field-Programmable Gate Array With Stacked 1D2R RRAM Array" IEEE Transactions on Very Large Scale Integration (VLSI) Systems, 24(1): 139-150 (Jan. 31, 2016).
Burr, Geoffrey W., et al., "Access devices for 3D crosspoint memory", Journal of Vacuum Science & Technology B, Nanotechnology and Microelectronics: Materials, Processing, Measurement, and Phenomena, 32(4), pp. 040802-1-040802-23, (Jul./Aug. 2014).
Degraeve, R., et al., "Generic learning of TDDB applied to RRAM for improved Understanding of conduction and switching mechanism through multiple filaments", In electron Devices Meeting (IEDM) IEEE International, pp. 28.4.1-28.4.4, (2010).
Gopalakrishnan, K., et al., "Highly-Scalable Novel Access Device based on Mixed Ionic Electronic Conduction (MIEC) Materials for High Density Phase Change Memory (PCM) Arrays", 2010 Symposium on VLSI Technology Digest of Technical Papers, IEEE, pp. 205-206, (2010).
Alibart, Fabien, et al., "High-Precision Tuning of State for Memristive Devices by Adaptable Variation-Tolerant Algorithm", Nanotechnology, 23(7), pp. 1-20, Jan. 2012).
Chua, Leon O., "Memristor—The Missing Circuit Element", IEEE Transactions on Circuit Theory, 18(5), pp. 507-519, (Sep. 1971).
Adam, Gina C., et al., "Optimized stateful material implication logic for three-dimensional data manipulation", Nano Research, Research Article, 9(12), pp. 3914-3923, (2016).
Chen, B., et al., "Physical Mechanisms of Endurance Degradation in TMO-RRAM", In Electron Devices Meeting, IEEE International, pp. 12.3.1-12.3.4, (2011).
Balatti, S., et al., "Pulsed cycling operation and endurance failure of metal-oxide Resistive (RRAM)", In Electron Devices Meeting (IEDM), IEEE International, pp. 14.3.1-14.3.4, (2014).
Akinaga, Hiroyuki, et al., "Resistive Random Access Memory (ReRAM) Based on Metal Oxides", Proceedings of the IEEE, 98(12), pp. 2237-2251, (Dec. 12, 2010).
Burr, Geoffrey W., et al. "Select Device Concepts for Crossbar Arrays", Resistive Switching: from Fundamentals of Nanoionic Redox Processes to Memristive Device Applications, pp. 623-660, (2016).
Balatti, Simone, et al., "Voltage-Controlled Cycling Endurance of HfO$_x$-Based Resistive-Switching Memory", IEEE Transactions on Electron Devices, 62(10), pp. 3365-3372, (Oct. 10, 2015).
Yang, Joshua, et al., "Engineering Nonlinearity into Memristors for Passive Crossbar Applications", Applied Physics Letters, 100(11), 5 pages, (2012).
Yi, Jaeyun, et al., "Requirements of Bipolar Switching ReRAM for 1T1R Type High Density Memory Array", International Symposium on VLSI Technology, Systems and Applications (VLSI-TSA), IEEE, pp. 1-2, (2011).
Chang, M.F., et al. "Low VDDmin Swing-Sample-and -Couple Sense Amplifier and Energy-Efficient Self-Boost-Write-Termination

(56) References Cited

OTHER PUBLICATIONS

Scheme for Embedded ReRAM Macros Against Resistance and Switch-Time Variations", IEEE Journal of Solid-State Circuits, 50(11), pp. 2786-2795, (2015).

Rana, A.M., et al. "*Endurance and Cycle-to-cycle Uniformity Improvement in Tri-Layered CeO2/Ti/CeO2 Resistive Switching Devices by Changing top Electrode Material*", Scientific Reports, vol. 7, (2017).

Wang, G., et al., "*Impact of program/erase operation on the performance of oxide-based resistive switching memory*", Nanoscale Research Letters, 10(1), p. 39, (2015).

Waser, R., et al., *Nanoionics-based resistive switching memories*, Nature Materials, vol. 6(11), pp. 833-840, Nov. 2007.

Zidan, M.A., et al., "*Memristor-based memory: The sneak paths problem and solutions*", Microelectronics Journal, vol. 44(2), pp. 176-183, (2013).

Baeumer, C., et al., "*Subfilamentary Networks Cause Cycle-to-Cycle Variability in Memristive Devices*", ACS Nano, vol. 11 No. 7, pp. 6921-6929, (2017).

Lee, A.R., et al., "*Memory window engineering of $Tz_2O_5$-x oxide-based resistive switches via incorporation of various insulting frames*", Scientific Reports, vol. 6, pp. 30333, (2016).

Schmelzer, E., Linn, et al., "*Uniform complementary resistive switching in tantalum oxide using current sweeps*", IEEE Electron Device Letters, vol. 34, No. 1, pp. 114-116, (2013).

Lv, C., et al., "*Evolution of conductive filament and its impact on reliability issues in oxide-electrolyte based resistive random access memory*", Scientific Reports, vol. 5, (2015).

Choi, S., et al., "*Data clustering using memristor networks*", Scientific Reports, vol 5, p. 10492, (2015).

Li, Can, et al., "*Analogue signal and image processing with large memristor crossbars*", Nature Electronics, No. 1, pp. 52-59, (Dec. 2017).

Li, Y, et al., "*Improvement of resistive switching characteristics in $ZrO2$ film by embedding a thin $TiOx$ layer*", Nanotechnology, 22(25), (2011).

\* cited by examiner (a)

(b)

HYBRID MEMRISTOR/FIELD-EFFECT TRANSISTOR MEMORY CELL AND ITS INFORMATION ENCODING SCHEME

CROSS-REFERENCE TO RELATED APPLICATIONS

This application is a U.S. National Phase application under 35 U.S.C. § 371 of International Patent Application No. PCT/CN2018/095297, filed Jul. 11, 2018, which claims the benefit of U.S. Provisional Patent Application No. 62/604,905, filed Jul. 26, 2017, both of which are incorporated by reference in their entireties.

BACKGROUND

In the search for the next generation of high-density, low-power, and high-performance memories, the memristor, a non-volatile memory (NVM) technology, stands out. The memristor is potentially superior to other NVM technologies due to the following three attributes: (1) the memristor's filamentary nature makes it virtually insensitive to the device's size, i.e. its size can be shrunk without degrading its memory properties, such as retention, switching time and ON/OFF ratio; (2) its highly non-linear switching dynamics allows elimination of an access element, e.g. a transistor, from the memory cell, which is beneficial for reducing the memory cell's complexity and size, since the access element usually dominates its overall size; and (3) a memristor has a simple metal-insulator-metal (MIM) structure. The combination of the second and third attributes makes it feasible to organize memristive devices in a resistive random-access memory (ReRAM) crossbar array in which a memristor is formed at each cross-point of the crossbar array.

These same attributes that make memristor technology potentially superior, are also the sources of its biggest limitations. Namely, the filamentary nature of memristors leads to large device to device (D2D) and cycle to cycle (C2C) variations, and the use of a crossbar array gives rise to the sneak-path problem.

The D2D and C2C variations are memory reliability issues that are caused by stochastic switching dynamics of memristors. They impose design constraints on peripheral memory circuitry, since the peripheral memory circuitry should be designed to accommodate for the worst-case scenario, and furthermore, they determine the endurance of the memory. Conventional techniques for tackling the D2D and C2C variations of memristors include improving memristor device structure, exploiting the voltage divider effects of a series resistor acting as a current compliance (CC), using an active feedback programming scheme, or by hybrid methods that combine an active feedback with CC techniques. These techniques are either too complex for main memory applications, as for the case of active feedback techniques, or still inadequate. In either case, a viable system-level solution to effectively handle the memristor's D2D and C2C variations is still elusive.

The sneak-path problem is a limitation resulting from the undesired effect of current consumption for partially selected memory cells. Partial selection occurs when a memory cell's neighboring cell is accessed. This problem may result in not only incorrect read operations, but also in highly inefficient read and write operations (<1%) in terms of energy consumption. The efforts of addressing the sneak-path problem range from including bulky active access elements, such as transistors, in the memory cell (known as the 1T1R architecture), to the insertion of strongly nonlinear two-terminal selectors in series with the memristor cells. Another idea of achieving cell selectivity is the use of the complementary resistive switch or CRS. While the CRS is a material-independent approach, unlike the other solutions that require specially crafted materials, its readout scheme is destructive and a restoring write operation is required after each read. By requiring a restoring write operation, complexity of the peripheral circuitry is increased, and in effect, read power, read bandwidth, and endurance of the memristor cells are negatively affected.

SUMMARY

An embodiment of the disclosure provides a ReRAM comprising a hybrid memory cell, wherein the hybrid memory cell comprises: (a) a left resistance-switching device comprising a first terminal and a second terminal, (b) a right resistance-switching device comprising a first terminal and a second terminal, wherein the first terminal of the right resistance-switching device is connected to the first terminal of the left resistance-switching device at an internal node, and (c) a transistor comprising a source terminal, a drain terminal, and a gate terminal, wherein the drain terminal of the transistor is connected to the left resistance-switching device and the right resistance-switching device at the internal node.

An embodiment of the disclosure provides a method for programming a hybrid memory cell of a ReRAM. The method includes: (a) applying a write voltage between a second terminal of a left resistance-switching device and a second terminal of a right resistance-switching device, wherein a first terminal of the left resistance-switching device is connected to a first terminal of the right resistance-switching device at an internal node; and (b) removing the write voltage after a predetermined time; wherein the hybrid memory cell comprises the left resistance-switching device, the right resistance-switching device, and a transistor.

An embodiment of the disclosure provides a method for determining a logic level of a hybrid memory cell of a ReRAM. The method includes: (a) applying a read voltage between a second terminal of a left resistance-switching device and a second terminal of a right resistance-switching device, wherein a first terminal of the left resistance-switching device is connected to a first terminal of the right resistance-switching device at an internal node; (b) applying a voltage bias at a gate of a transistor, wherein the drain of the transistor is connected to the internal node; and (c) sensing voltage at the internal node via the source of the transistor; wherein the hybrid memory cell comprises the left resistance-switching device, the right resistance-switching device, and the transistor.

DETAILED DESCRIPTION

Figure 1:
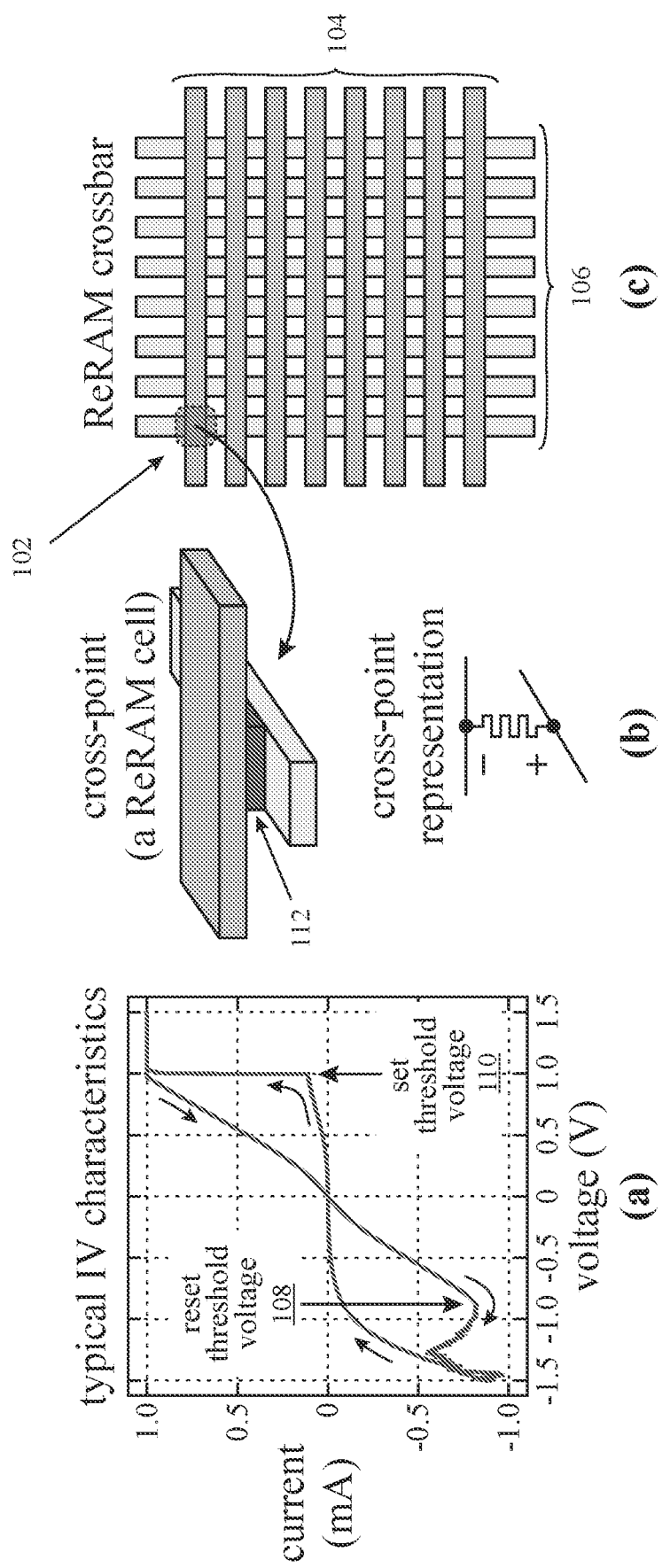
FIG. 1 illustrates: (a) current-voltage characteristics for a bipolar memristor according to an embodiment of the disclosure; (b) a symbol and simplified structure of a memristor according to an embodiment of the disclosure; and (c) a crossbar array of ReRAM cells according to an embodiment of the disclosure.

Embodiments of the disclosure provide a resistive random-access memory (ReRAM) architecture based on a hybrid memory cell (a H3 cell) comprised of two memristive devices and an access transistor. In an embodiment, the access transistor may be a minimum-sized transistor (mT), where the mT is a transistor with the smallest dimensions that can be manufactured in a chosen transistor technology. A minimum-sized transistor may be, for example, a minimum-sized field-effect transistor (mFET). The H3 cell provides several advantages, including, e.g., effectively taking advantage of the scaling potential of both memristor and transistor technologies. The two memristive devices or memristors in an H3 cell are connected in series to form a voltage divider, so the ratio of their resistances is used to store information, rather than using absolute resistance values as traditionally done in ReRAM-based memories. The mT in an H3 cell, connected to the mid-point between the two series-connected memristors, can be used to read the state of the H3 cell without destroying the content stored in the H3 cell, i.e., no restoring write is required. The mT can also be used as a current compliance to assist the electroforming and set operations of the ReRAM cells. The ReRAM architecture according to some embodiments also solves the sneak-path problem by keeping at least one of memristors in an H3 cell in a high resistance state. Compared to the traditional current-sensing-based approach for memory read of ReRAM cells, the ratio-based voltage sensing scheme is more robust and less prone to the large device to device (D2D) and cycle to cycle (C2C) variations of memristive devices. Furthermore, architectural solutions according to some embodiments addressing the D2D and C2C variations are orthogonal and complementary to any improvements made at the memristor device-level.

In the disclosure, the term 'memristors' may be used to refer to resistance-switching devices, and the term 'ReRAM' may be used to refer to resistance-switching devices used as memory elements. Also in the disclosure, mT may be used to refer to a minimum-sized transistor, but it is to be understood that the H3 cell can operate with transistor sizes sized larger than a minimum-sized transistor. A generic structure of a memristor is a stack of two electrodes sandwiching a thin layer of insulating material. As fabricated, a memristor typically exhibits a very high resistance across its two terminals in an unformed state. An initial one-time electroforming step is usually performed after fabrication. The electroforming process includes applying a voltage or current sweep across the device until a soft breakdown of the thin insulating layer occurs, creating a conductive filament and leaving the memristor in a low resistance or ON state. A device in this condition is considered formed. The process of changing the memristor from an ON state back to a high resistance, or OFF, state is called a reset operation, and it is characterized by the partial destruction of the conductive filament, which increases the memristor's resistance. The process of changing the memristor from an OFF to ON state is called a set operation, in which the conductive filament is created again, decreasing the resistance of the device. Depending on the material stack used in the memristor, and in its electroforming procedure, a bipolar or unipolar operation can be observed. A bipolar memristor utilizes positive voltages to set the device and negative voltages to reset it, whereas for a unipolar device, both set and reset operations can be performed with the same voltage polarity. Bipolar devices are generally preferred as they have a tendency to utilize smaller reset currents compared to unipolar devices.

Part (a) of FIG. 1 illustrates a typical pinched hysteresis loop in the current versus voltage (I-V) plot of a $TiO_x$-based bipolar memristor according to an embodiment of the disclosure. For the device in part (a) of FIG. 1, the set operation occurs with a voltage of around 1 V. The reset operation starts with a voltage of around −0.9 V and finishes at around −1.3 V. Note that whereas the set operation is abrupt, the reset operation is gradual. Set threshold voltage 110 and reset threshold voltage 108 can be defined based on I-V characteristics of part (a) of FIG. 1. The gradual evolution of the reset operation can be exploited to encode multiple memory levels on a memory cell. The state of a memristor is determined by either applying a known voltage and sensing a current, or vice versa. In a current-based sensing approach, a low voltage, e.g., in the range of −0.2 V and 0.2 V is applied, and the resulting current is sensed and compared with a reference current. A current-based sensing approach is one way of determining a memory cell's state in ReRAM-based memories.

Part (b) of FIG. 1 illustrates a structure and representation of an individual ReRAM cell, and part (c) of FIG. 1 illustrates a ReRAM crossbar architecture. An array of memristors can be constructed based on the crossbar architecture. A crossbar of memristors is formed by two perpendicular layers of parallel wires, top electrodes 104 and bottom electrodes 106, with a thin layer of switching material 112 deposited in between. The ReRAM crossbar architecture can achieve a very high memory density. When both the wires and spaces between wires are of width F, the memory cell has a size $4F^2$. This is called the 1TnR architecture as for every wire there are n ReRAM devices involved and 1 transistor at the end of the line to access it. To access a device in a 1TnR array, a high potential is applied to its row, and a low potential to its column, or vice versa. The resulting current flowing through the ReRAM cell either indicates the state of the cell (for a read) or is the current needed to change the state of the cell (for a set or reset). Without a strong nonlinear characteristic in the I-V curves of each cross-point, there will be several 'sneak paths' between the higher potential wire and the lower potential wire. This is referred to as the sneak-path problem. Collectively, all currents flowing through these sneak paths are added to the current through the target cross-point, which can reduce the read margin and significantly increase power consumption of the read and write operations.

Figure 2:
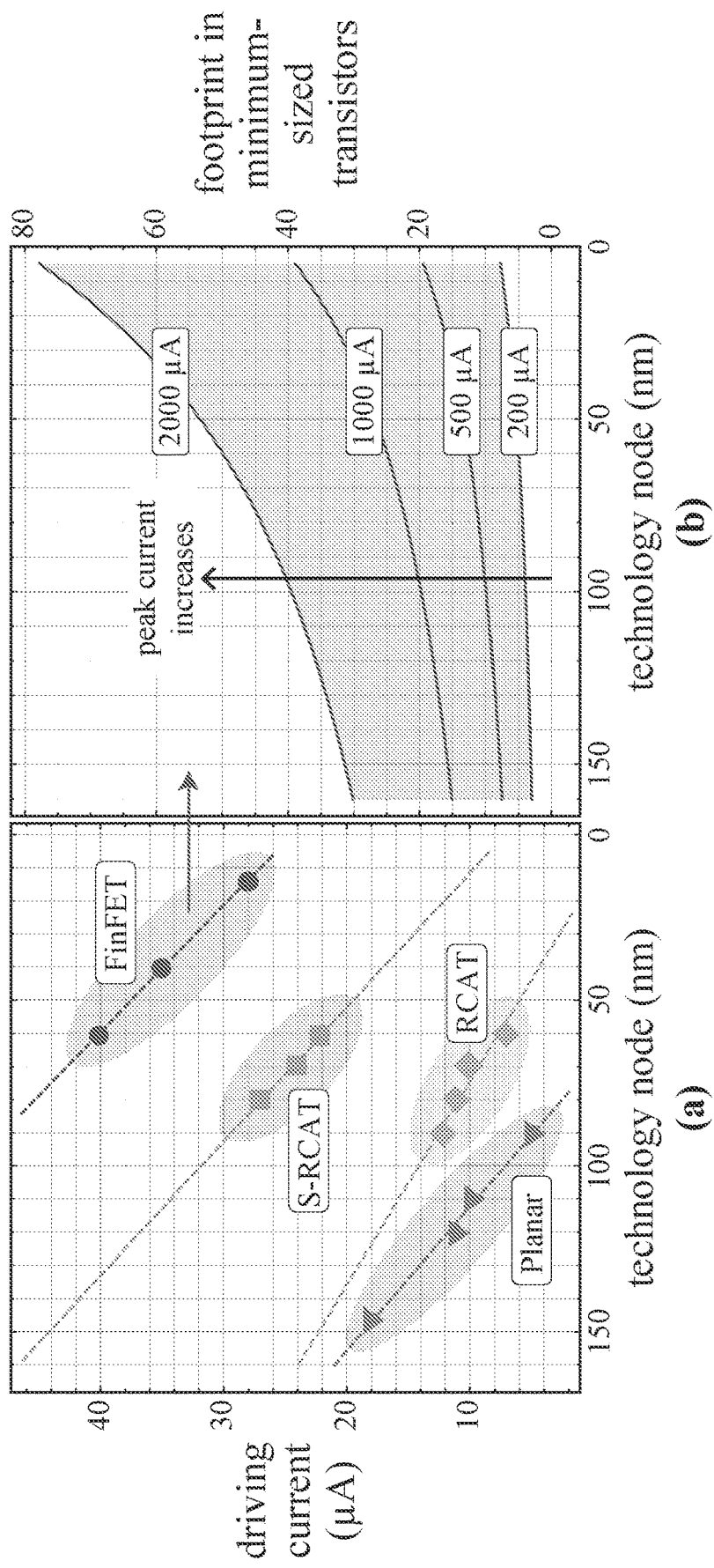
FIG. 2 illustrates: (a) data results showing evolution of saturation current of several minimum-sized transistor types as a function of technology node; and (b) data results showing footprint of a transistor in units of number of minimum-sized transistors for supplying peak currents in the range of 200 μA to 2000 μA as a function of technology node in a 1T1R ReRAM array.

The sneak-path problem can be solved by including an access transistor for each ReRAM cell (1T1R architecture). However, the driving current of a minimum-sized transistor may not be enough to meet the peak current requirements of ReRAM cells, especially during the reset operation. For yield and reliability reasons, the 'peak current' is not typically used as the write current, but rather the peak current is a conservatively large current, as to accommodate for worst-case scenario under non-trivial process variations. As shown in part (a) of FIG. 2 with data from Samsung® and IBM® devices, the driving current of a minimum-sized transistor decreases with the technology downscaling, regardless of the transistor type. In part (b) FIG. 2, using the FinFET technology, a 1T1R array has to pair a transistor that is >10× bigger than a minimum-sized transistor with each memristor, thus annulling the scaling potential of ReRAM.

Other approaches to the sneak-path problem include the insertion of a strongly nonlinear two-terminal selector in series with each memristor to form a ReRAM cell. Such a selector can be directly engineered into an integrated ReRAM cell or can be a discrete device, such as a threshold switch or with copper-containing mixed ionic-electronic conducting (MIEC) materials. Yet another alternative to solving the sneak-path problem is the use of a complementary resistive switch or CRS. The CRS is a two-terminal device formed by two anti-serially connected bipolar memristors. Unlike a memristor whose information is encoded as an electrical resistance (HIGH or LOW) across its terminals, a CRS stores binary information as the internal configuration of their two memristors, with one logic state encoded as HIGH/LOW and the other encoded as LOW/HIGH. By keeping at least one memristor in a high resistance state, both configurations in a CRS have a high resistance, effectively blocking the sneak paths. Unfortunately, as previously mentioned, the CRS readout is destructive, which negatively affects the performance and endurance of the memory.

As discussed earlier, memristors suffer from device to device (D2D) and cycle to cycle (C2C) variations. The D2D variations are due to process variations from manufacturing processes of memristors, but D2D variations are exacerbated by stochasticity of the initial electroforming step of the memristors. Electroforming is a positive-feedback process that is hard to control, but inherently affects many resulting properties of a formed memristor device, such as performance, variability, and endurance. Once formed, a device also suffers from C2C variations due to stochasticity associated with formation and destruction of the conductive filament during the regular set and reset cycles. Ultimately, the D2D and C2C variations determine a memristor's endurance, that is, the maximum number of cycles the memristor can be reliably cycled, since the memristor's ON/OFF window tends to slowly narrow throughout its lifetime. The narrowing of the ON/OFF window can be attributed to degradation of the ON state, the OFF state, or both.

Both D2D and C2C variations have been independently tackled via device improvement and by using a current compliance (CC) to control the rapid formation of the conductive filament during the set and electroforming operations. The degree of success of using a CC depends on the response time of the CC and on its close proximity to the memristor. A field-effect transistor (FET) that is in close proximity to a memristor, as in a 1T1R memory cell, is one way to enforce local CC during the electroforming and set operations. Silicon-based FETs have advantages of being fast, exhibiting very low OFF leakage, and being amenable to aggressive downscaling. Furthermore, silicon-based FETs can be mass-produced with very high yield and reliability. Unfortunately, as explained above, the size of the FET is significantly larger than the size of the memristor, annulling the scaling potential of ReRAM.

Embodiments of the disclosure provide a material-independent architectural solution to the sneak-path problem and D2D and C2C variations. The architectural solution is a $6F^2$ hybrid ReRAM memory cell, referred to as an H3 cell, comprising two memristors and a minimum-sized transistor, referred to as an mT. The mT can be any type of electrically controlled switch, e.g., a bipolar transistor or any transistor in the FET family (e.g. metal-oxide-semiconductor field effect transistor (MOSFET), thin-film, FinFET, carbon nanotube, and so on). The H3 cell can use an information encoding scheme that stores state of the H3 cell as a ratio of the two memristors' resistances, instead of an absolute value of the two memristors' resistances. Additionally, the H3 cell enables a sneak-path-free memory architecture with a non-destructive readout.

The prevailing conventional ReRAM architecture, the 1T1R, has been successfully used to reduce the variability of ReRAM by using the transistor in a 1T1R cell as a current compliance. However, in spite of the aggressive downscaling for silicon-based FETs, the transistor in a 1T1R cell needs to be significantly larger (>10×) than a minimum-sized transistor, as it needs to drive enough current to write into the ReRAM cell, which thus dominates the overall size of a 1T1R cell, annulling the scaling potential of ReRAM.

Embodiments of the disclosure provide a hybrid transistor-memristor memory cell, an H3 cell, that harnesses the scaling potential of both transistor and memristor technologies. The H3 cell is advantageous over the 1T1R cell since the H3 cell can be constructed using a minimum-sized transistor. The minimum-sized transistor of the H3 cell is not used to write into the ReRAM cell but simply to pass a voltage during a read. The H3 cell, however, enjoys benefits of 1T1R memory cells, namely being sneak-path-free, the transistor in the cell can be used as a current compliance to assist the electroforming and set operations of the memristors, and the transistor in the cell can be used to reduce the probability of erroneous write operations. In some embodiments, a set or a reset operation is considered a write operation. Furthermore, in contrast to a CRS-based memory cell, the read operation of an H3 cell is non-destructive. In some embodiments, using a voltage-based ratio encoding for H3 cells results in much sharper logic '1' and logic '0' state distributions compared to traditional current-based approaches for determining the state of a ReRAM cell, and is much less sensitive to changes of the memristors' resistances. Thus, a non-volatile memory based on the H3 cell can overcome negative effects due to large variations in memristors. The non-volatile memory based on the H3 cell can offer comparable performance and memory densities of dynamic random access memory (DRAM), and thus, can be an excellent option for highly integrated and persistent storage-class memories.

Figure 3:
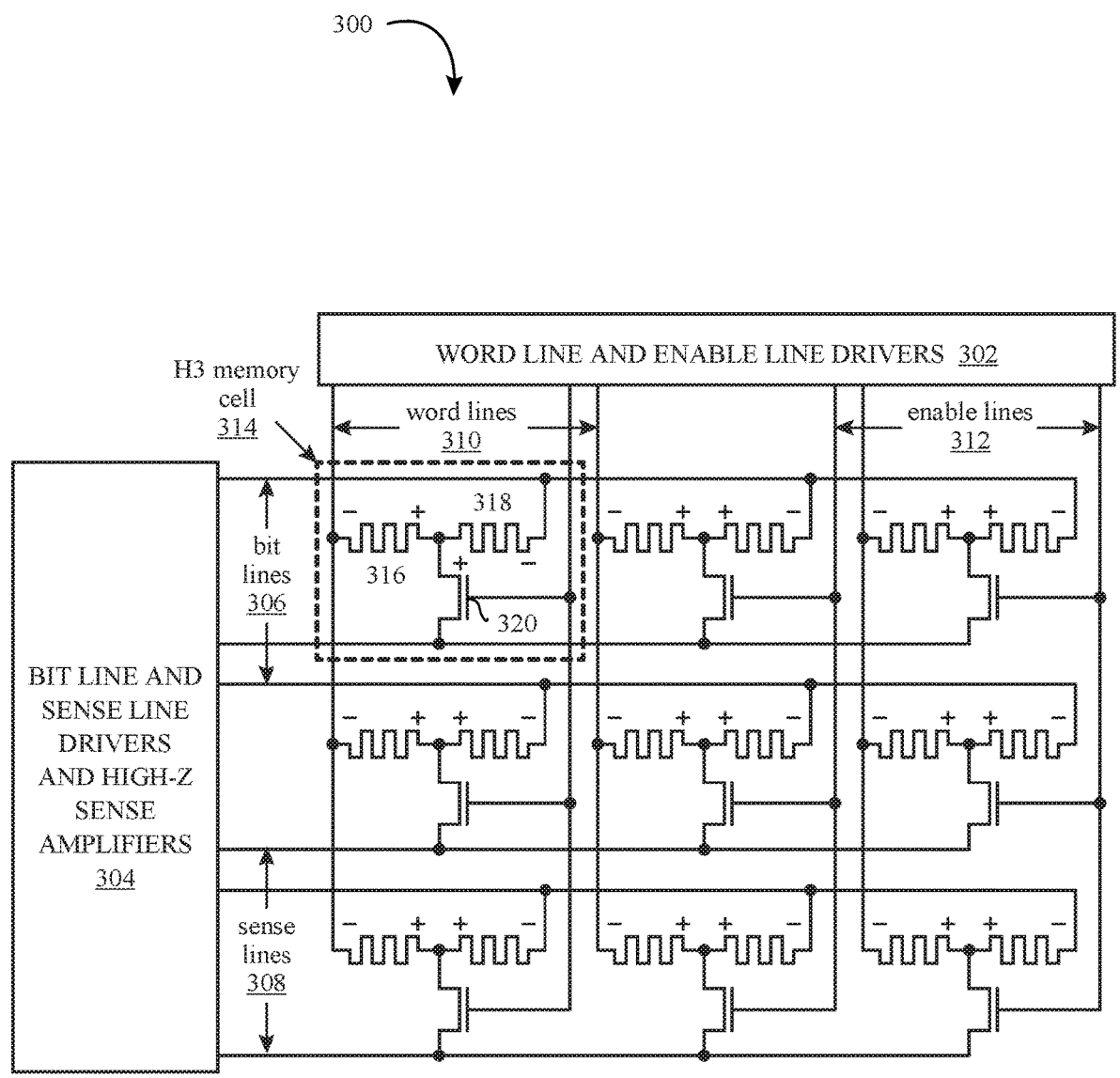
FIG. 3 illustrates a ReRAM memory architecture according to an embodiment of the disclosure.

In an embodiment, a ReRAM memory can be organized as an array of memory cells controlled by peripheral read and write circuitry via two sets of control lines: (1) word lines and bit lines, and (2) enable lines and sense lines. FIG. 3 illustrates a memory architecture 300 including a 3×3 array of nine H3 cells, control lines, and supporting peripheral circuitry, according to an embodiment of the disclosure. The H3 memory cell 314 includes two memristors, a left memristor 316 and a right memristor 318, and an mT 320. The two memristors are anti-serially connected, as in a CRS cell, forming a three terminal device with two external electrodes and one internal or shared electrode. The external electrode on the left memristor 316 is connected to a single word line in the word lines 310, and the external electrode of the right memristor 318 is connected to a single bit line in the bit lines 306. The gate electrode of the mT 320 is connected to a single enable line in the enable lines 312, the drain terminal of the mT 320 is directly connected to the internal (shared) electrode of the memristors, and the source terminal of the mT 320 is connected to a single sense line in the sense lines 308. Note that transistor source and drain terminals can be used interchangeably where when one is identified as a source, the other is therefore the drain. That is, the drain of mT 320 can be connected to a sense line and the source of mT 320 connected to the internal node shared by the left memristor 316 and the right memristor 318. Word line and enable line drivers 302 are connected to the word lines 310 and enable lines 312 of the memory. Bit line and sense line drivers and high-impedance sense amplifiers 304 are connected to the bit lines 306 and the sense lines 308 of the memory.

Although, the H3 memory cell 314 in FIG. 3 uses an n-type transistor or an NMOS device, H3 cells can be constructed with p-type transistors or PMOS devices in place of the NMOS devices. NMOS devices are typically beneficial because they are smaller than PMOS devices, and also when using the right polarity of the memristors, NMOS devices can naturally help during electroforming, set and reset operations. For example, assume that the memristors in an H3 cell are anti-serially connected and have a polarity such that a positive voltage should be applied at the middle electrode (with respect to either external electrode) to set and electroform a memristor (and a negative voltage to reset it). In such scenario, an NMOS device is more advantageous since when passing a large positive voltage, the NMOS will saturate and present a higher effective resistance, which is beneficial since the NMOS is being used as a current compliance for the set and electroforming operations. During reset operations, the NMOS will be able to inject more current since it will be used to pass a low voltage. This same analysis can be made assuming that the memristors in an H3 cell have the opposite polarity to that previously discussed (i.e., a negative voltage needs to be applied at the middle electrode with respect to the external electrodes in order to set and electroform). In such scenario, a PMOS device would be preferred, as it will be more efficient passing higher voltages rather than lower voltages.

An H3 cell stores binary information in a similar way as in a CRS cell. A logic '1' is encoded with the left memristor 316 in a high resistance state HRS, and the right memristor 318 in a low resistance state LRS (a HRS|LRS configuration). Similarly, a logic '0' is stored with the left memristor 316 in a LRS and the right memristor 318 in a HRS (a LRS|HRS configuration). The state of the H3 memory cell 314 is not determined using CRS's destructive readout scheme, which involves applying a large programming voltage and inferring memory cell state based on the presence or absence of a static (or spike of) current. Instead, the state of an H3 cell is determined based on the ratio of resistances of the left memristor 316 and the right memristor 318, i.e., the binary state of the H3 cell is based on whether or not this resistance ratio is less than or greater than 1.

In an embodiment, the analog state of an H3 cell can be defined as the voltage level at the internal (shared) electrode when a read voltage $V_{read}$ is applied to the external electrode of the left memristor 316 while grounding the external electrode of the right memristor 318. The binary state of an H3 cell is simply determined by comparing its analog state with a reference voltage $V_{read}/2$. The binary state of the H3 memory cell 314 can be read by: (1) enabling the mT 320 (by asserting the corresponding enable line 312); (2) applying a read voltage $V_{read}$ (which is small and non-destructive) across the left memristor 316 and the right memristor 318 (through the word line 310 and bit line 306); and (3) sensing the voltage at the internal (shared) electrode ($V_{shared}$) with a high-impedance sense amplifier 304 at the end of the sense line 308. If $V_{shared} > V_{read}/2$, the binary value stored in the H3 memory cell 314 is logic '1'. Otherwise (i.e. $V_{shared} < V_{read}/2$), the binary value is logic '0'. This is a voltage-based sensing approach, in contrast to a traditional current-based sensing approach, for ReRAM cells.

In an embodiment, an H3 cell can be constructed in a manner where the two memristors of the H3 cell are not configured in an anti-serial connection, i.e., the two memristors of the H3 cell can be configured in a serial connection. An anti-serial connection provides a convenient way of programming an H3 cell in a single step without requiring the use of the mT, but if the devices are serially connected, the H3 cell can still be programmed, but the mT has to be used in order to complete the write transitions. Two ways of implementing the write operation are provided, based on whether or not the mT alone can provide enough current to individually set and reset a memristor (i.e. as in a 1T1R cell).

If the mT can set and reset a memristor individually, logic '1' (HRS|LRS) is written by applying a voltage of 0V to the selected bit line and word line, and applying a positive voltage V which is higher than $\max(|V_{th+}|, |V_{th-}|)$ on the selected sense line. $V_{th+}$ is the set threshold voltage and $V_{th-}$ is the reset threshold voltage of the memristor. This condition on the applied voltage ensures that the left memristor of the serially connected H3 cell selected is reset and the right memristor is set. Logic '0' is written similarly applying a voltage of −V in the sense line. All other unselected bit, word, sense and enable lines are grounded (disabled for the enable lines).

If the mT cannot set and reset a memristor individually, then a two-step process is taken. In each step, a voltage pulse is applied on the selected bit, word and sense lines. The first step (step 1) of the two-step process programs the H3 cell into a HRS|HRS configuration, and the second step (step 2) finishes the write operation into the desired state.

For example, logic '1' can be programmed or written using the following two-step process. In step 1, a voltage −V/2 is applied to the selected word line and +V/2 is applied to the selected bit and sense lines, and the selected H3 cell is enabled by providing a bias to the selected enable line. In step 2, the voltage applied to the selected bit line is changed from +V/2 to −V/2. Logic '0' can be programmed or written using the following two-step process. In step 1, a voltage −V/2 is applied to the selected word and sense lines and +V/2 is applied to the selected bit line, and the selected H3 cell is enabled by providing a bias to the selected enable line. In step 2, the voltage applied to the selected word line is changed from −V/2 to +V/2. In both cases above with respect to programming or writing logic '1' and logic '0', during both step 1 and step 2, unselected word and bit lines are grounded, i.e., they have 0V applied to them. Unselected H3 cells are disabled, and unselected sense lines are disconnected, i.e., they are left floating.

Figure 4:
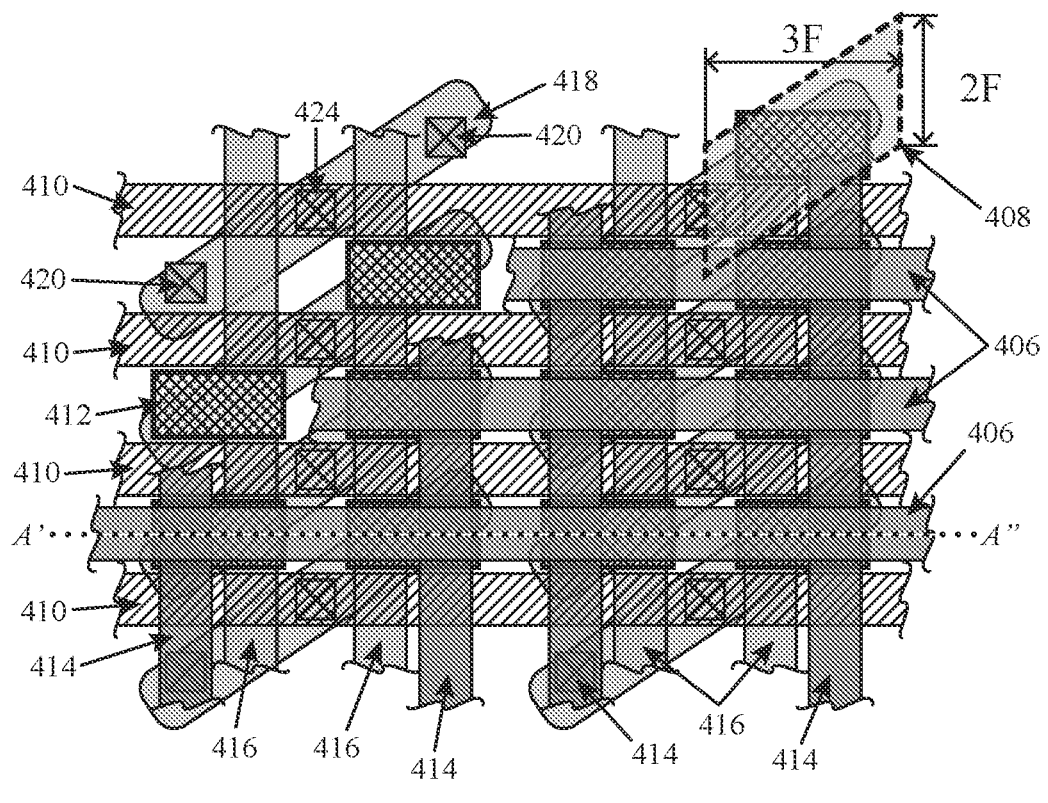
FIG. 4 illustrates: (a) a top layout view of ReRAM cells according to an embodiment of the disclosure; and (b) a cross-sectional layout view of a part of the layout in part (a) of FIG. 4.
Figure 4:
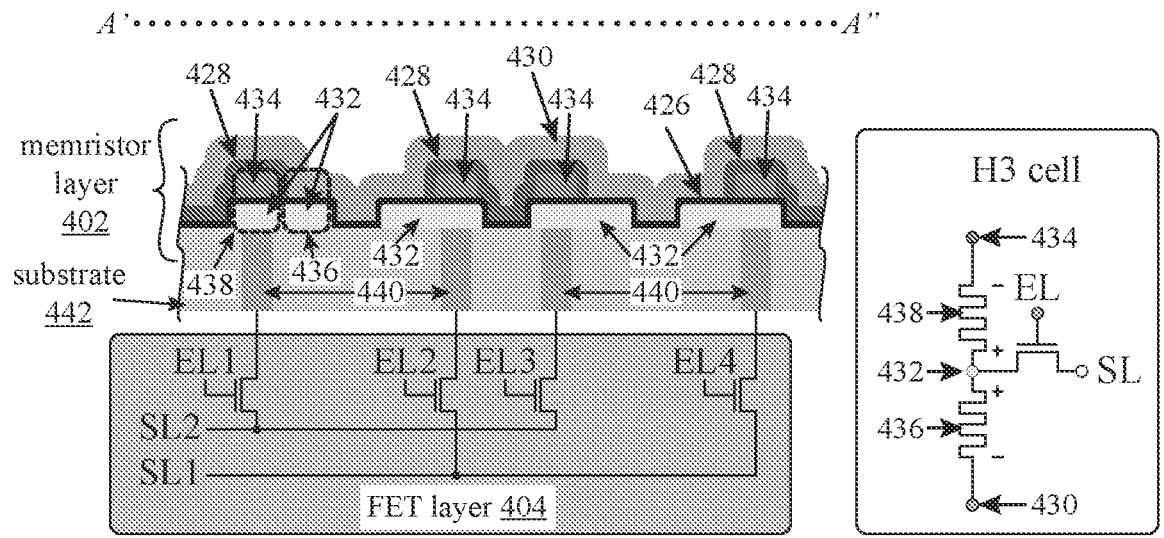

Part (a) of FIG. 4 illustrates top view of a layout for 6F² H3 cells using CMOS (complementary metal oxide semiconductor) technology according to an embodiment of the disclosure. Part (b) of FIG. 4 illustrates a cross sectional view of the layout in part (a) of FIG. 4 along the line indicated by the A' and A" labels. A 6F² H3 cell is identified with label 408 in part (a) of FIG. 4. Each H3 cell is built on two layers, a CMOS/FET layer 404 and a memristor layer 402. Memristors for the H3 cells can be fabricated on a substrate 442. The substrate 442 contains contact plugs 440 that electrically connect the CMOS/FET layer 404 to the memristor layer 402. In an embodiment, the contact plugs 440 are surrounded by thermal oxide, such that substrate 442 represents the thermal oxide. That is, the CMOS layer includes metallization layers (metal layer and interconnection vias). The contact plugs 440 are thus the top vias in the standard CMOS process. The contact plugs 440 are surrounded by thermal oxide, which is planarized, e.g., with chemical mechanical polishing (CMP). On top of this planar substrate, i.e., the thermal oxide, which has the exposed vias or plugs that are connected all the way down to the CMOS/FET devices, is where the ReRAM layer is monolithically fabricated.

The CMOS/FET layer 404 contains an array of minimum-sized field effect transistors (mFETs) 404 as well as supporting CMOS peripheral circuitry for reading and writing H3 cells of the memory. In an embodiment, memristor layer 402 can be monolithically integrated on top of the CMOS/FET layer 404, and interfaced via the contact plugs 440 to the source terminals of the mFETs 404. The layout in part (a) of FIG. 4 is inspired by a typical slanted 6F² layout for 1T1C (1-transistor 1-capacitor) DRAM. DRAM arrays achieve high memory densities by packing minimum-sized transistors, and thus, in an embodiment, a similar principle can be borrowed for an H3 cell-based memory. Using DRAM's notation, the layout in FIG. 4 is a capacitor over bit line (COB) DRAM layout, as access to the source of the mFET is needed to contact the internal (shared) electrode of the left and right memristors (shown as bottom electrodes 432). Bottom electrodes 432 electrically connect with the contact plugs 440, and the bottom electrodes 432 indicate internal shared electrodes of left and right memristors in the H3 cells of part (b) of FIG. 4.

Following a standard ReRAM notation, a ReRAM cell is formed with a top electrode and a bottom electrode. In part (b) of FIG. 4, top electrodes are indicated as labels 430 and 434, and bottom electrodes are indicated with label 432. Also in part (b) of FIG. 4, top electrode 434 is the top electrode indicating one terminal of the left memristor 438, and top electrode 430 is the top electrode indicating one terminal of the right memristor 436. The left memristor 438 and the right memristor 436 share the bottom electrode 432.

In an embodiment, turning to part (a) of FIG. 4, word lines 414 are used as top electrodes for left memristors (i.e., word lines 414 in part (a) of FIG. 4 correspond to top electrodes 434 in part (b) of FIG. 4), and bit lines are used as top electrodes for right memristors (i.e., bit lines 406 correspond to top electrodes 430). The bottom electrodes (i.e., internal nodes and connection between left memristors and right memristors) is shown with label 440, and in part (a) of FIG. 4 the contact plugs 440 connect directly to source contacts 420. The resistive switching material 426 in the memristors is shown between top and bottom electrodes. Enable lines 416 connect to gates of the mFETs of the H3 cells, and source lines 410 connect to the drains of the mFETs via drain contacts 424. Note that active areas 418 indicate active areas on the CMOS/FET layer 404. Top metal pad contacts 412 provide access to the enable lines 416 on the CMOS/FET layer 404. Thermal oxide depositions 428 electrically isolates top electrodes 434 and 430.

Note that in contrast to the traditional crossbar architecture (refer to parts (b) and (c) of FIG. 1) in which a memristor is formed at the crosspoint between a word line and a bit line, in the layout of FIGS. 4, the left memristors and the right memristors are formed with the top electrodes 434 and 430, respectively, and common bottom electrodes 432, whose size is doubled, as the internal (shared) electrode of the H3 cells. Hence, word and bit lines are isolated with thermal oxide 428 in part (b) of FIG. 4.

The left and right memristors in an H3 cell form a voltage divider. In an embodiment where memristor ON/OFF ratios are sufficiently large, the sensed voltage at the internal (shared) electrode will be very close to either the reference ground potential for logic '0', or $V_{read}$ for logic '1'. Taking variations into account, encoding and reading the state of an H3 cell as a voltage divider results in much narrower logic '0' and '1' state distributions than directly using a memristor's resistance as the state. Therefore, the signal margin for separating logic '0' and '1' is significantly increased, and probability of error is substantially reduced. A ratio-based encoding also eliminates some adverse effects related to an absolute value of a memristor's resistance. In some embodiments, the absolute value of the memristor's resistance is taken into account when designing sense amplifiers at the end of the sense lines. Higher resistances cause longer time to charge the sense lines and thus slow down the read operation. The voltage reference signal ($V_{read}/2$) is determined solely by the read voltage $V_{read}$, and not by the actual resistance of the memristors, as is the case for the traditional current-sensing approach. Furthermore, such voltage reference does not need to change with the aging of the memory, in contrast to the current-sensing approach's needs to cope with the memristor's possible resistance drift due to aging and temperature variations. Additionally, the state of an H3 cell is bounded between the 0 V and $V_{read}$ range (compared to an unbound memristor state that can be arbitrarily high or low), which can significantly simplify design of the sensing circuitry.

The number of components in an H3 cell may create a misperception that an H3 cell will have a larger footprint than a 1T1R cell, since an H3 cell can be viewed as a 1T2R cell. However, note that the transistor in a 1T1R cell is significantly larger than a minimum-sized transistor so that the transistor in a 1T1R can drive the necessary current to set and reset a memristor (see part (b) of FIG. 2). On the other hand, the transistor in an H3 cell can be minimum-sized, as it is only used to pass a voltage for the read operations. The current required for the set and reset operations to write an H3 cell-based memory comes from larger transistors located at the periphery of the memory array, as shown in FIG. 3. For this attribute, a memory constructed with H3 cells is similar to a 1TnR crossbar, but with a more robust and non-destructive readout scheme. Furthermore, an mT in an H3 cell can also assist in electroforming of the memristors and in set operations. The mT, being physically close to the memristors and having a relatively high resistance (e.g., >10 kΩ), becomes a local CC and helps reduce the effects caused by memristors' C2C and D2D variations. Compared to a traditional 4F² memristor crossbar, the H3 cell is more complex and 50% larger, however the added benefits of the H3 cell, particularly by solving the sneak-path problem, justify the extra complexity and area overhead.

Two experiments (E1 and E2) were constructed to compare performance of ratio-based voltage sensing encoding to a traditional current-based approach. The results of experiments E1 and E2 are summarized in FIGS. 5 and 6, respectively.

E1 Experiment

The E1 experiment involved highlighting the extent of D2D and C2C variations of memristors and reducing the effect caused by such variations using ratio-based encoding according to embodiments of the disclosure. Three pairs of pristine (unformed) memristors (D1, D2 and D3) were used in E1. Each pair included two anti-serially connected bipolar memristors (D #A and D #B), corresponding to left and right memristors, respectively, in an H3 cell. Physically, each pair was fabricated as a small 1×2 crossbar with two bottom electrodes (B1 and B2) and one top or middle electrode (M), as schematically shown in the inset in part (a) of FIG. 5. Experimental steps for E1 were as follows:

(1) Each memristor was individually electroformed by applying a quasi-static current sweep of 5 µA at the M electrode, grounding the bottom electrode of the memristor being formed, and leaving the other bottom electrode floating.

(2) Once formed, each memristor was individually reset with a negative voltage sweep of −1.6V applied to the M electrode while grounding the bottom electrode of the memristor that was being reset. The bottom electrode of the memristor not being reset was left floating.

(3) Then, each memristor was set and reset for four cycles with a voltage sweep of 1.6V for set and −1.5V for reset, applied at the M electrode and grounding/floating the corresponding bottom electrode. For the set operation an external CC of 1 mA was used.

(4) The memristors were cycled four additional times, but as a pair (D1, D2 and D3), by applying a voltage sweep of 2V and −2V at the B1 electrode, grounding the B2 electrode, and measuring the voltage at the M electrode.

Figure 5:
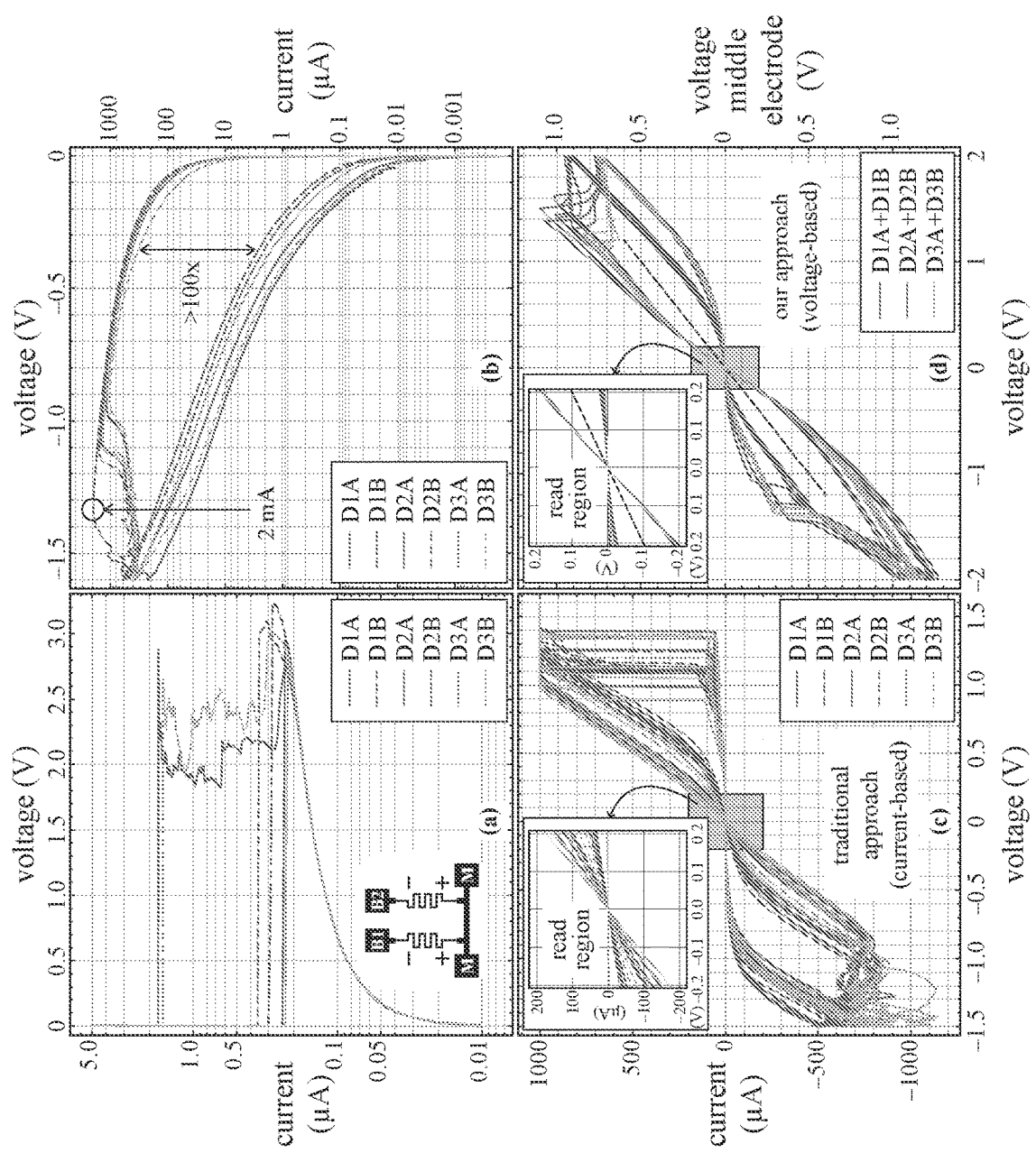
FIG. 5 shows measurement results for an experiment conducted according to an embodiment of the disclosure.

FIG. 5 shows experimental results for E1 with part (a) showing results during electroforming, part (b) showing results of first reset after electroforming, part (c) showing four set/reset cycles using traditional current-based approach and zoomed-in view of the read region, and part (d) showing four cycles using voltage-based approach according to an embodiment of the disclosure and a zoomed-in view of the read region.

Part (a) of FIG. 5 shows the applied current and measured voltage at the M electrode for each device during its electroforming step. All devices exhibited an initial high resistance of 8 MΩ at 1 V and began to form with a voltage of around 3 V.

Part (b) of FIG. 5 shows voltage applied and current measured at the M electrode for each memristor device during its first reset. Large ON/OFF ratios of at least 100 were measured for all memristor devices. The D2D variations were evident in the distribution of the OFF state and in the absolute resistance values for both ON and OFF states. Some devices, e.g. D1B, required particularly large currents (≈2 mA) to reset. In memory structures, supporting write circuitry would have to be designed to accommodate for such worse case currents.

Part (c) of FIG. 5 and its inset show high degree of variations in the I-V plot during regular set/reset cycles. Device D3A for instance, had strong ON states (55-85 µA @ 100 mV), others, e.g. D1B, exhibited weak ON states (15-25 µA @ 100 mV), and others, e.g. D2B, showed tighter distributions on their ON state (43-47 µA @ 100 mV). Based on the data from all six devices and four cycles, the mean value for the ON state is 40±20 µA @ 100 mV and the mean value for the OFF state is 0.53±0.18 µA @ 100 mV. While a threshold can be identified to distinguish the two states for all six devices, the optimal threshold would be device-dependent and likely deviate throughout the lifetime of the memory.

Part (d) of FIG. 5 and its inset show four cycles of sweeping the memristors as a pair (D1, D2 and D3). Instead of using an I-V plot, the encoding uses a voltage-voltage (V-V) plot, in which the x-axis is the applied voltage at the B1 electrode, and the y-axis is the sensed voltage at the M electrode. As a visual cue, a black dashed line at y=x/2 is included to indicate an ideal voltage threshold. Part (d) of FIG. 5 and its inset show that voltage-based, ratio-based encoding according to an embodiment of the disclosure achieves much tighter state distributions, in comparison with the traditional current-based approach of part (c) of FIG. 5. Based on the data from all three memristor pairs and four cycles, the mean value for the logic '1' state is 95±1.3 mV at 100 mV, and the mean value for the logic '0' state is 4.7±2.4 mV at 100 mV. The memristor devices used in part (d) of FIG. 5 were the same devices as those used in part (c) of FIG. 5, and to minimize the effect of device degradation/aging, the four V-V sweeps were conducted immediately after the four I-V sweeps for each pair.

E2 Experiment

No single set of write voltages (for set and reset) will be optimal for all memristors in a memory system. Programming voltages being too low may result in partial switching. Programming voltages being too high may end up with either excessively thick filaments during sets, or the over-RESET problem during resets. A consequence of using a fixed set or programming voltages is that some memristors, over their lifetime, may accumulate errors in their state to the point of corrupting encoded data. The E2 experiment involved demonstrating robustness of ratio-based sensing with respect to changes in the ON/OFF ratio and absolute ON/OFF resistances throughout the lifetime of a memristor.

Another pair of memristors (devices D4A and D4B) with the same configuration, same electroforming, and same initial reset, as described in experiment E1 was used. In addition E2 further involved the following experimental steps:

(1) Independently set and reset D4A and D4B in batches of 20 cycles, with 10 µs voltage pulses applied at their M electrode, while grounding the bottom electrode. No CC was enforced. A pulse of 1.3 V was used for set, and −1.7 V for reset. After each set/reset pulse, a read pulse of 100 mV was applied, and the current was measured and integrated for 1 ms.

(2) D4A and D4B were cycled again, but as a pair. 10 µs voltage pulses of 2 V and −2 V were applied at the B1 electrode, grounding the B2 electrode. After each pulse, a read pulse of 100 mV was applied, and the voltage at the M electrode was measured and integrated for 1 ms.

(3) After each 20-cycle batch, visual assessment was performed to determine whether a device's window had started to close, and if so, a manual voltage-sweep was performed on the device to bring restore its original window (i.e., a refresh operation was performed).

Figure 6:
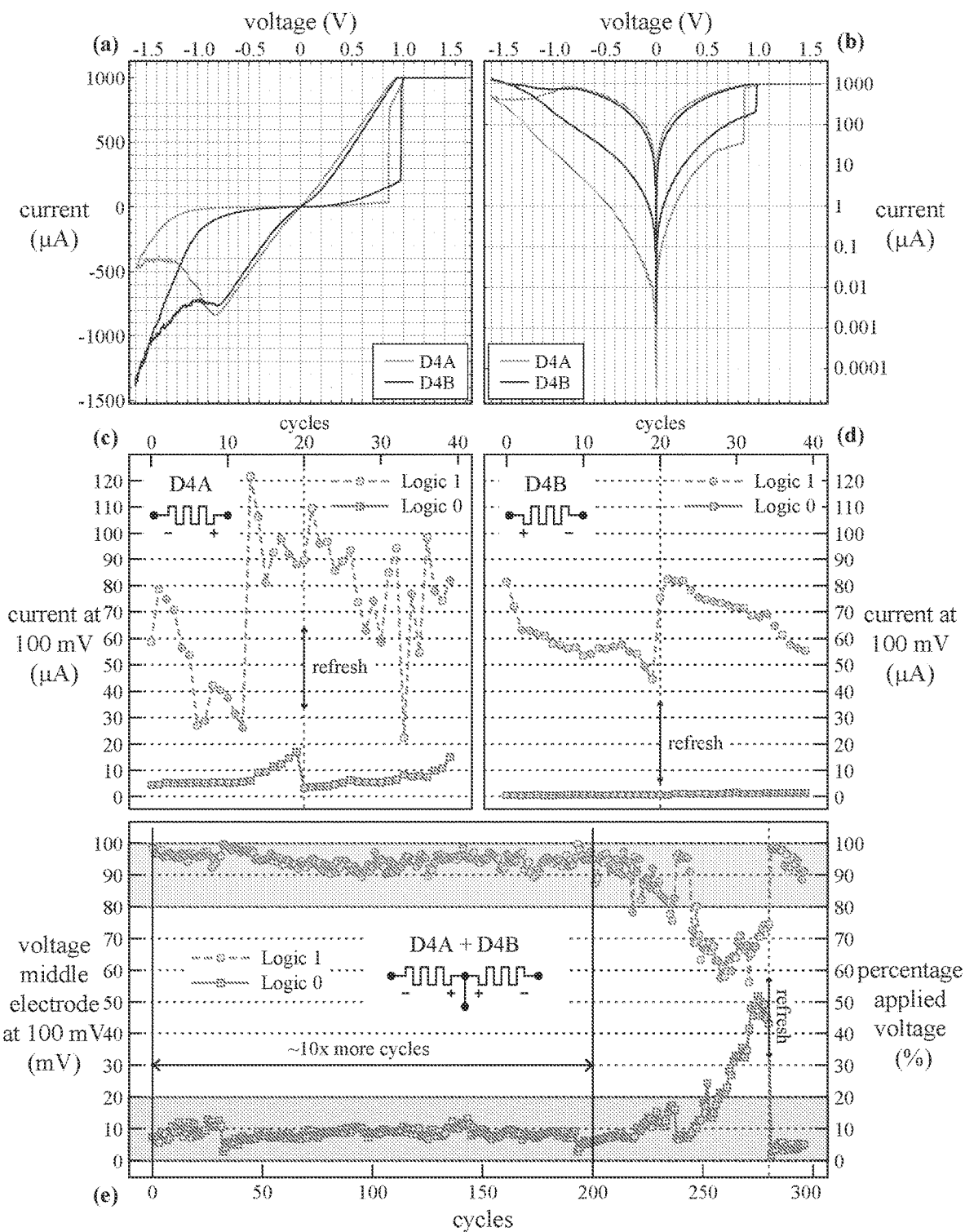
FIG. 6 shows measurement results for another experiment conducted according to an embodiment of the disclosure.

FIG. 6 shows experimental results for E2 with parts (a) and (b) illustrating characteristic I-V plots for memristor devices D4A and D4B in linear and logarithmic scales, respectively. Part (c) and (d) show evolution of devices D4A and D4B after 40 set/reset cycles with a refresh performed at cycle 20. Part (e) illustrates results of 300 programming cycles of D4A and D4B as a pair.

Memristor devices D4A and D4B were chosen due to the large discrepancy in their I-V characteristics, as shown in parts (a) and (b) of FIG. 6 for linear and logarithmic scales, respectively. Device D4A was found to have a particularly weak OFF state (1.7 µA at 100 mV), which contrasted to the stronger OFF state of device D4B (0.28 µA at 100 mV). The ON states for devices D4A and D4B were 57 µA at 100 mV and 94 µA at 100 mV, respectively.

Parts (c) and (d) of FIG. 6 show results of the evolution over 40 cycles of the states of devices D4A and D4B, respectively. For both results, the devices were manually refreshed after every 20-cycle batch. For device D4A, the OFF state started to gradually degrade while the ON state displayed a large dispersion with a mean value of 73±25 µA at 100 mV. For device D4B, the gradual degradation occurred in the ON state, with a tighter OFF state—a mean value of 0.95±0.34 µA at 100 mV. Assuming that a memristor's state was distributed in the range of 0 µA to 100 µA at 100 mV bias, a sense margin of 40% was obtained for device D4B and a sense margin of 5% was obtained for device D4A.

Part (e) of FIG. 6 illustrates that voltage sensing ratio-based encoding is much less sensitive to the changes exhibited by the memristor devices compared to the current-based approach. Part (e) of FIG. 6 further illustrates that the number of cycles between refreshes can be increased by a factor of 10×+. The state distributions of logic '1' and '0' were significantly sharper (95±2.1 mV at 100 mV and 8.4±1.7 mV at 100 mV) and all values were within 15-20% of the maximum and minimum ranges, leaving a decision margin of about 60-70%, as shown in part (e) of FIG. 6.

Experiments E1 and E2 demonstrated robustness of ratio-based voltage sensing encoding and its capacity to reduce effects of D2D and C2C variations of memristors. Mathematical analysis and Monte Carlo simulation were performed to quantitatively estimate increase in data reliability of an H3 cell, by calculating a cell's error probability. The intuition of why the error probability of a current-based approach is higher than that of a voltage-based approach is that for a current-based approach, an error occurs if one of two conditions is met: either the ON state is below the reference or the OFF state is above the reference. For the voltage-based approach, an error occurs when the ON (i.e. low resistance) state of one memristor becomes higher than the OFF (i.e. high resistance) state of the other memristor, which is less likely to happen.

To simplify the mathematical analysis, assume that under all D2D and C2C variations, the ON and OFF states of a memristor are normally distributed with mean $\mu_{on}$ and standard deviation $\sigma_{on}$ for the ON state and $\mu_{off}$ and $\sigma_{off}$ for the OFF state. Using a current-based sensing approach, $\mu_{on}$, $\sigma_{on}$, $\mu_{off}$ and $\sigma_{off}$ are all in units of current, and thus $\mu_{on} > \mu_{off}$ as shown in the inset in part (a) of FIG. 7. Further assume that $X_{on}$ and $X_{off}$ are two normally distributed random variables described by [$\mu_{on}$, $\sigma_{on}$] and [$\mu_{off}$, $\sigma_{off}$] respectively.

In the current-based approach, given a global, fixed reference $G_{ref}$, $X_{on}$ will be correctly considered a logic '1' if $X_{on} > G_{ref}$, and $X_{off}$ will be correctly considered a logic '0' if $X_{off} < G_{ref}$. Let A be the event of incorrectly interpreting $X_{on}$ as logic '0', and B the event of incorrectly interpreting $X_{off}$ as logic '1'. For a traditional current-based approach, the probability of A occurring can be expressed as:

$$P(A) = P(X_{on} < G_{ref}) = \int_{-\infty}^{G_{ref}} \frac{e^{-\frac{(x-\mu_{on})^2}{2\sigma_{on}^2}}}{\sqrt{2\pi\sigma_{on}^2}} = \frac{\sqrt{1/\sigma_{on}^2} - \sigma_{on}\, erf\left[\frac{\mu_{on} - G_{ref}}{\sqrt{2}\,\sigma_{on}}\right]}{2\sigma_{on}},$$

and the probability of B occurring can be expressed as:

$$P(B) = P(X_{off} > G_{ref}) = \int_{G_{ref}}^{\infty} \frac{e^{-\frac{(x-\mu_{off})^2}{2\sigma_{off}^2}}}{\sqrt{2\pi\sigma_{off}^2}} = \frac{\sqrt{1/\sigma_{off}^2} - \sigma_{off}\, erf\left[\frac{\mu_{off} - G_{ref}}{\sqrt{2}\,\sigma_{off}}\right]}{2\sigma_{off}}.$$

Assuming an equal probability for a cell to store logic '0' or logic '1', the probability of storing an erroneous logic value using a current-based approach (EPC) can be calculated as:

$EPC = 0.5 \times P(A) + 0.5 \times P(B)$.

In a voltage-based approach, an H3 cell uses two memristors to encode information. Assuming that variations of both memristors follow the same [$\mu_{on}$, $\sigma_{on}$] and [$\mu_{off}$, $\sigma_{off}$] parameters defined above, the probability of storing an erroneous logic '1' will be equivalent to the probability of storing a logic '0'. Regardless of the logic stored in an H3 cell, the state of one memristor will be given by $X_{on}$ while the other will be given by $X_{off}$. Thus, an H3 cell will store an erroneous logic value if $X_{on} < X_{off}$, and probability of this can be determined by evaluating $X_{on} - X_{off} < 0$. Since both $X_{on}$ and $X_{off}$ are normally distributed, their difference is also normally distributed. Therefore, the probability of an H3 cell storing an erroneous logic value under a voltage-based approach (EPV) can be expressed as:

$$EPV = P(X_{on} - X_{off} < 0) = \frac{1}{2}\left(erf\left[\frac{\mu_{off} - \mu_{on}}{\sqrt{2}\,\sqrt{\sigma_{off}^2 + \sigma_{on}^2}}\right] + 1\right).$$

Figure 7:
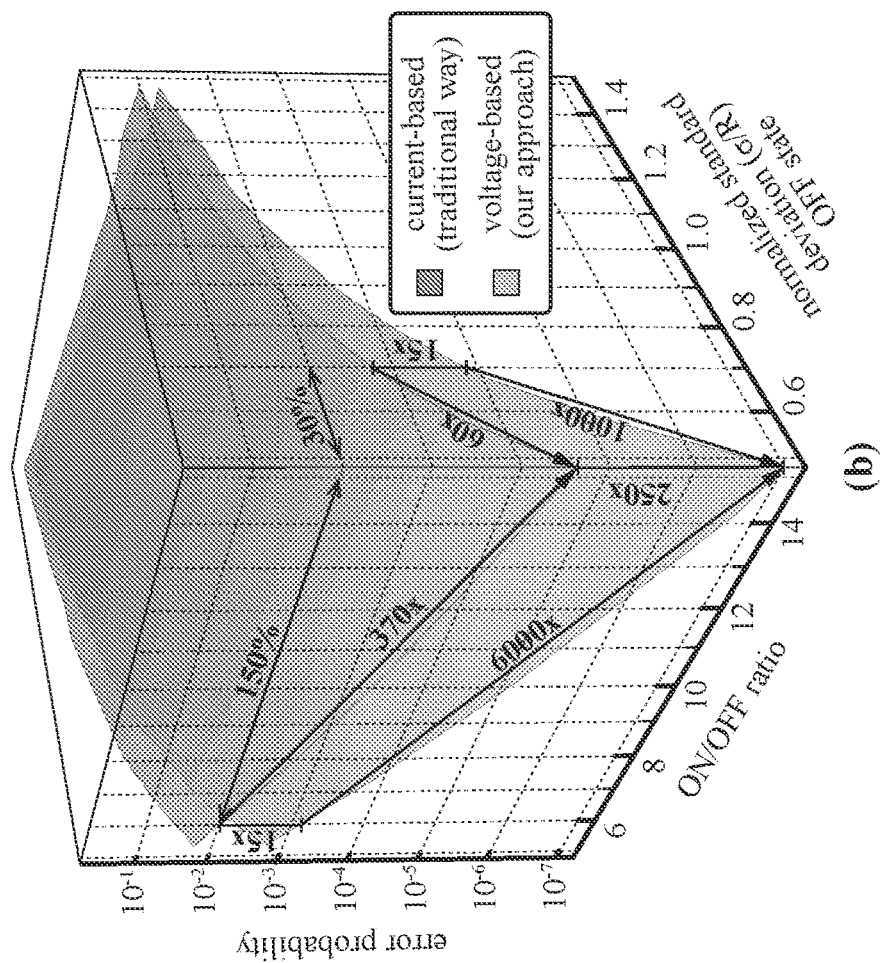
FIG. 7 illustrates modeling results of error probability between voltage-based encoding according to embodiments of the disclosure and current-based encoding.
Figure 7:
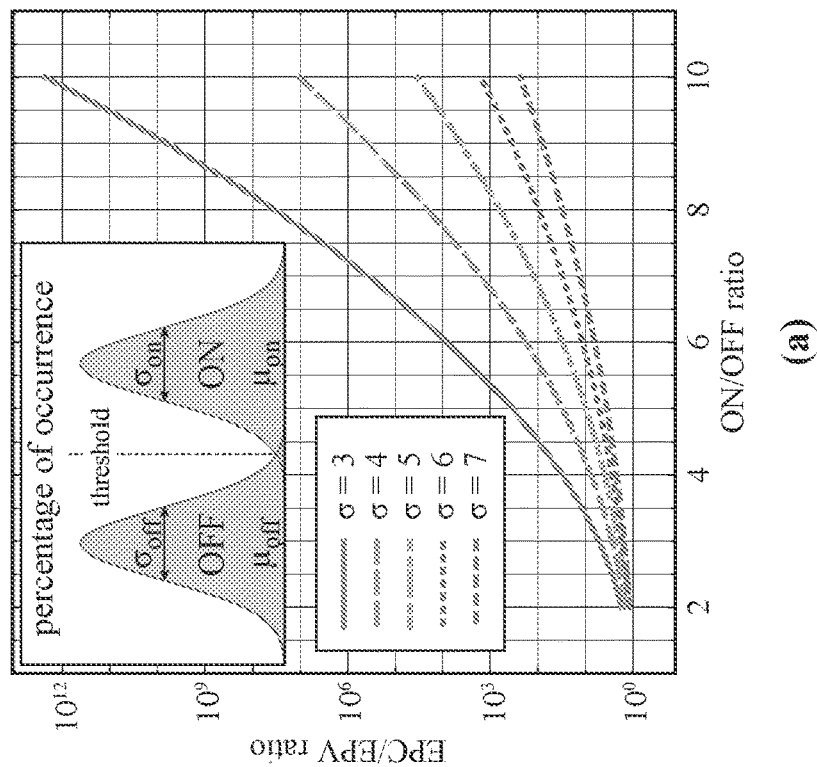

To eliminate the $G_{ref}$ variable from the EPC, further assume that both ON and OFF states have the same standard deviation ($\sigma_{on} = \sigma_{off} = \sigma$), thus the optimal global reference $G_{ref}$ of the current-based approach is ($\mu_{on} + \mu_{off}$)/2. Part (a) of FIG. 7 shows a numerical example of relative performance of a voltage-based approach according to embodiments of the disclosure compared to a current-based approach through a EPC/EPV ratio. The expected EPC/EPV ratio is plotted as a function of the ON/OFF ratio ($\mu_{on}/\mu_{off}$ ratio) under various σ values in the range of 3 to 7, for a base OFF state of $\mu_{off} = 5$. Both $\mu_{off}$ and σ are given in arbitrary units. As shown in part (a) of FIG. 7, linear changes to both the ON/OFF ratio and σ result in super-exponential improvement in the error probability of the voltage-based approach (EPV) compared to the current-based approach (EPC). FIG. 7 illustrates a comparison of error probability between the voltage-based encoding and the current-based approaches with part (a) of FIG. 7 assuming normally distributed ON and OFF states and part (b) of FIG. 7 assuming log-normally distributed ON and OFF states.

In part (b) of FIG. 7, the estimated error probability for the current-based and voltage-based approaches, based on Monte Carlo simulation using parameters for $HfO_x$-based memristor devices extracted from the experimental data.

The ON and OFF resistance state distributions can be described by a log-normal distribution. Since ON and OFF resistances are being used in the log-normal distribution and ON resistance is less than OFF resistance definitions of $\mu_{on}$ and $\mu_{off}$ change with $\mu_{on} > \mu_{off}$ in an error state. That is, it is expected that an OFF state will have a "higher" resistance value than an ON state. Assume the mean value for the ON state of 20 kΩ with a normalized standard deviation ($\sigma/R_{on}$) of 0.1, an ON/OFF ratio in the range of 5 to 15, and a normalized standard deviation ($\sigma/R_{off}$) in the range of 0.5 to 1.5. For each pair of ON/OFF ratio and $\sigma/R_{off}$, a log-normal distribution for the ON and OFF states is fit, and a Monte Carlo simulation was run for 1 billion set/reset cycles and the error probability under a current-based and a voltage-based approach was computed.

As shown in part (b) of FIG. 7, a reduction of the normalized standard deviation ($\sigma/R_{off}$) by 30% (from 0.7 to 0.5) reduces the error probability of a current-based approach by about 60×, but the same 30% reduction reduces error probability of the voltage-based approach by a factor of 1000× (a gain of 16×). Similarly, an increase of the ON/OFF ratio by 150% (from 6 to 15) reduces the error probability of a current-based approach by 18×, but reduces the error probability of the voltage based approach by 64× (a gain of 3.5×). Based on the experimental data, the ratio-based voltage-sensing encoding scheme can reduce the error probability by up to two orders of magnitude, in comparison with the current-based approach.

Figure 8:
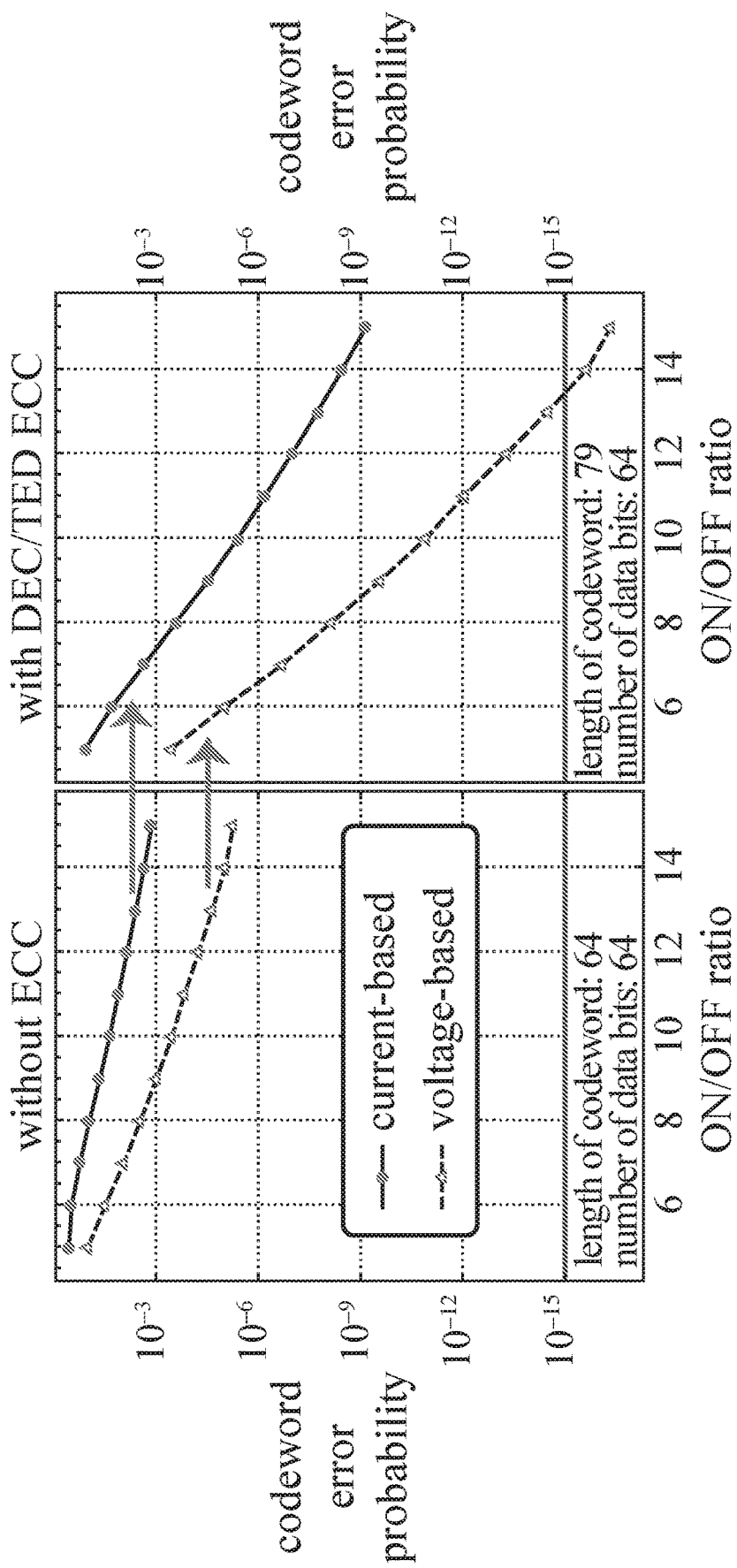
FIG. 8 illustrates the effect of error correcting code on codeword error probability according to an embodiment of the disclosure.

Error probability numbers can be further reduced using error correcting schemes. As shown in part (a) of FIG. 8, assuming a codeword of 64 bits, the codeword error probability on a current-based approach is no better than $10^{-3}$, whereas the voltage-based approach according to some embodiments is closer to $10^{-5}$. As shown in part (b) of FIG. 8, if a standard BCH double-error-correction, triple-error-detection (DEC/TED) error-correcting code (ECC) is employed, the codeword error probability of the current-based approach is still not low enough (around $10^{-9}$) for standard memory applications, but for the voltage-based approach, the probability can be less than $10^{-15}$. As such, ratio-based voltage-sensing encoding can be applied to existing devices to produce low enough error probabilities for memory applications.

Memory Array Evaluation

Figure 9:
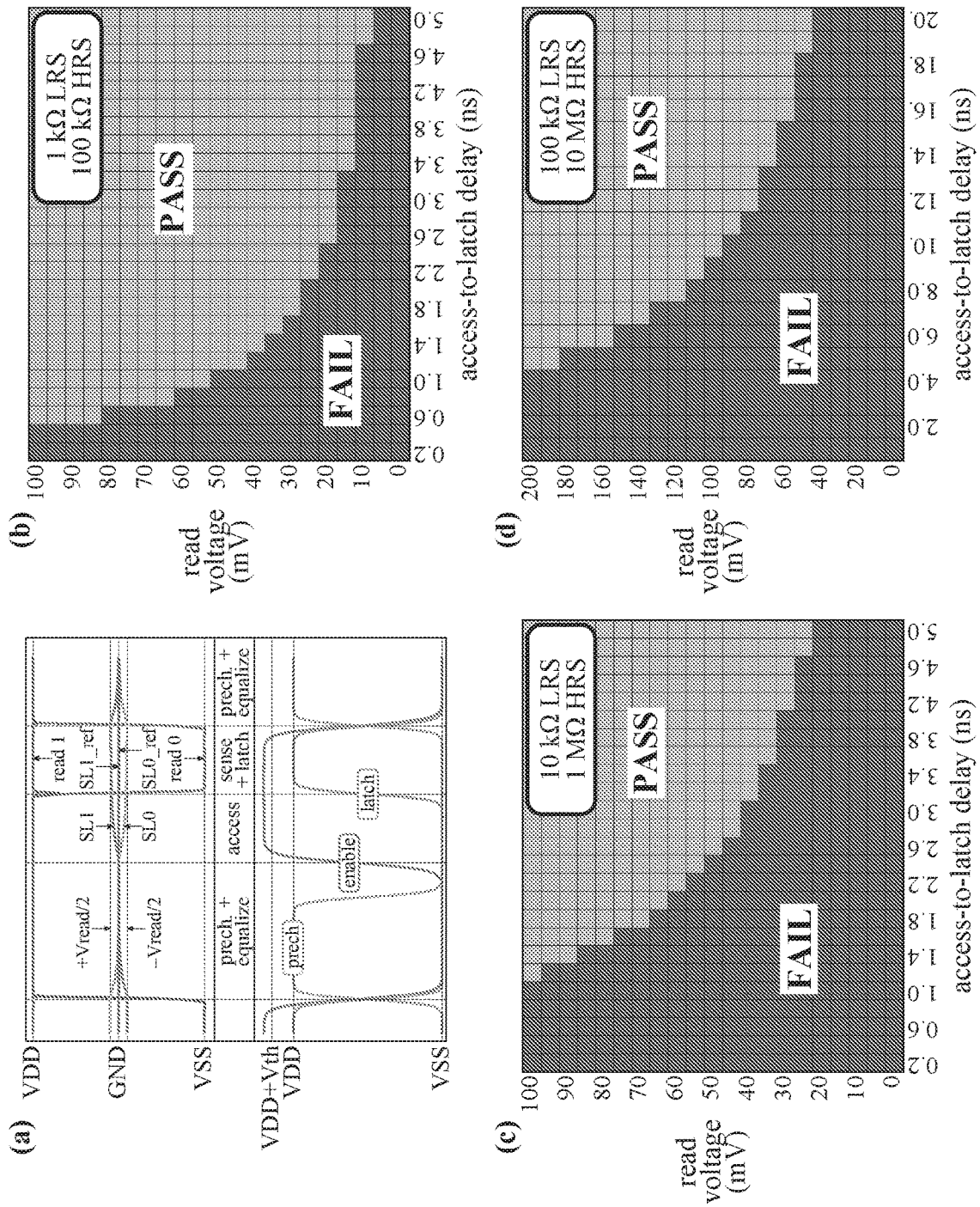
FIG. 9 illustrates simulation results of voltage-based encoding in a ReRAM memory according to an embodiment of the disclosure.

Read operation of a H3 cell in a memory array is limited by speed of CMOS read circuitry, but mainly by the time it takes the memristor in LRS state (either the left or right memristor) in an H3 cell to charge its sense line. Thus the critical delay in a read operation will be given by the delay between the time the mT is enabled and the time the voltage is latched by the voltage comparator at the end of the sense line (access-to-latch delay). The time diagram of a typical voltage-based read operation in a 1 Mb (1024×1024) array is shown in part (a) of FIG. 9. Parts (b)-(d) of FIG. 9 show SPICE-simulated shmoo plots on a 130 nm technology node as a function of the read voltage and access-to-latch delay for various LRS and HRS values. ON/OFF ratios for the simulation was set at 100. For memristors with a LRS of 10 kΩ or less, random-access read latencies of a few nanoseconds can be obtained.

Programming or write operation of an H3 cell can be implemented in two ways: as a regular write, in which the mT of the H3 cell is turned OFF; and with write-assist, in which the mT of the H3 cell is enabled and used to assist the set and reset operations of the memristors. Write-assist can be implemented in two steps, in which the source of the mT of the H3 cell is connected to a voltage $V_{ASSIST}$. During the first step, $V_{ASSIST}=V/2$, and during the second step, $V_{ASSIST}=V/2$ (regardless of the data being stored). The first step sets the H3 cell into an intermediate LRS|LRS state, and the second step completes the write operation into a desired logic state.

A regular write operation can be performed on an H3 cell in the same manner as in a CRS cell. For instance, if starting with an H3 cell in a LRS|HRS state (logic '0') and applying a positive write voltage, the H3 cell will initially transition to a LRS|LRS state and eventually to a HRS|LRS state (logic '1'). Similarly, starting from a HRS|LRS state and applying a negative write voltage, the H3 cell will transition to a LRS|HRS state, passing through the LRS|LRS state. Complexity of a regular write operation of an H3 cell is comparable to that of a memristor, i.e., they can both be achieved by applying a single write pulse (positive or negative). However, the write operation of an H3 cell involves more transitions and interaction of more elements (HRS|LRS ⇆ LRS|LRS ⇆ LRS|HRS), compared to a regular memristive write (HRS ⇆ LRS). Thus, an H3 cell's write operation (as well as a CRS's) has more stringent set threshold voltage ($V_{th+}$) and reset threshold voltage ($V_{th-}$) requirements. In particular, the distributions of $V_{th+}$ and $V_{th-}$ should be sharper and $|V_{th-}|$ should be less than or equal to $|V_{th+}|$.

In an embodiment, a lower bound for a write voltage is $|2*V_{th-}|$. The lower bound can be derived as follows: Assume an initial configuration of LRS|HRS. If the applied voltage $V_{applied} > |V_{th+}|$, then the device will transition to the LRS|LRS configuration. Under an assumption that the LRS of both devices are similar and have an ohmic behavior, then in order to reset the second device (to get the desired HRS|LRS configuration), the applied voltage should be at least twice as large as the reset voltage of an individual device ($|V_{th-}|$). That is, $V_{applied} > |2*V_{th-}| > |V_{th+}|$.

Figure 10:
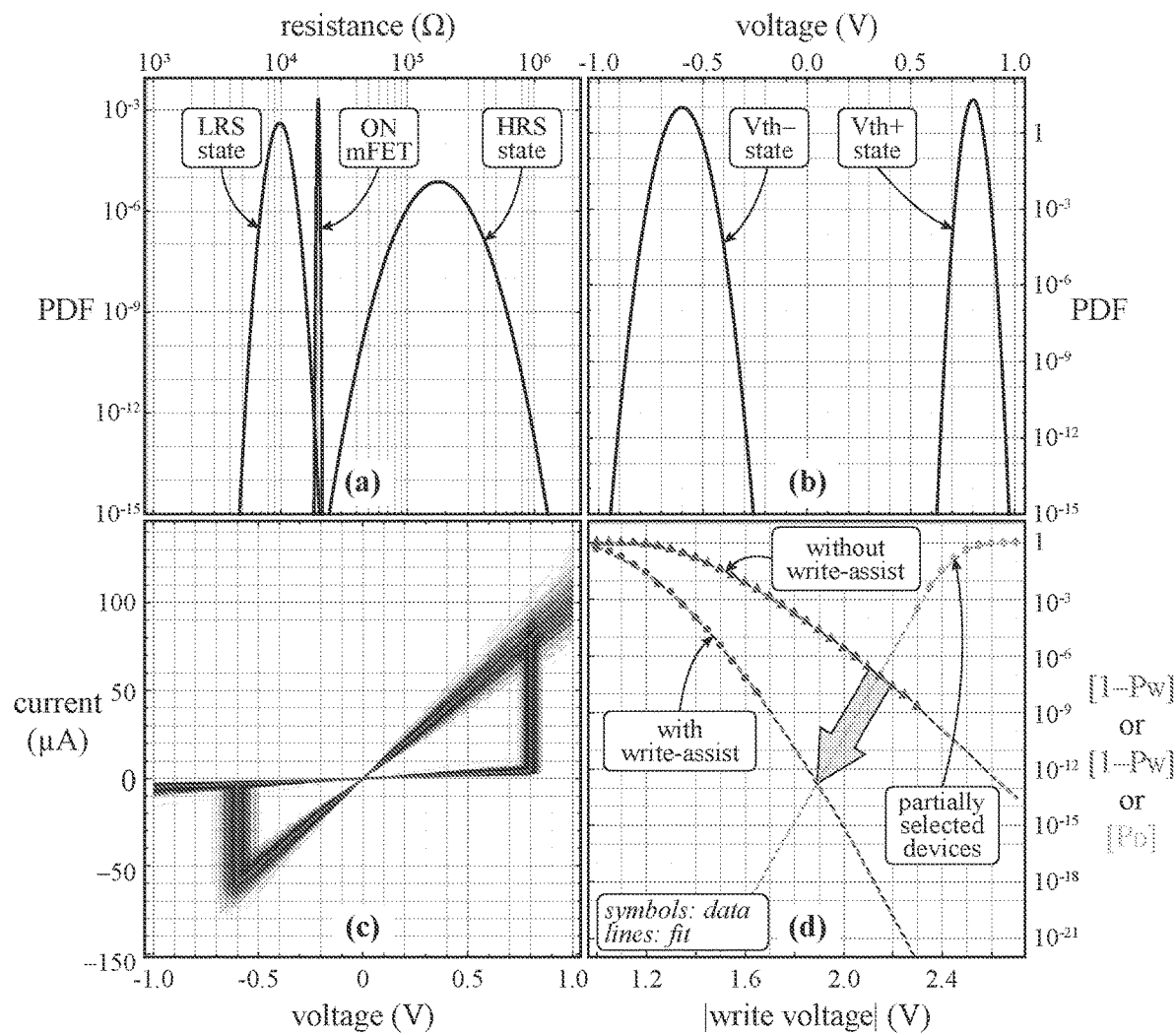
FIG. 10 illustrates: (a) example distributions of low resistance state of a memristor, high resistance state of a memristor, and ON resistance of a minimum-sized transistor; (b) set and reset threshold distributions; (c) I-V curves of 1000 cycles of a simplified memristive model following the distributions illustrated in parts (a) and (b); and (d) simulation results of write-assist according to an embodiment of the disclosure.

In an example, part (a) of FIG. 10 shows a distribution for the LRS and HRS states of a memristor, and part (b) of FIG. 10 shows distribution of $V_{th+}$ and $V_{th-}$. Part (c) of FIG. 10 shows 1000 simulated cycles using a simplified threshold-based memristor model with the distributions shown in parts (a) and (b) of FIG. 10. Part (d) of FIG. 10 shows 1-$P_W$ as a function of write voltage, where $P_W$ is defined as the probability that all possible transitions in an H3 cell (HRS/LRS ⇆ LRS/LRS ⇆ LRS/HRS) can be successfully performed, as a function of the write voltage, for a given set of LRS, HRS, $V_{th-}$ and $V_{th+}$, under a regular write operation. Additionally, part (d) of FIG. 10 also shows probability $P_D$ of accidentally disturbing a partially selected H3 cell as a function of the write voltage, assuming a V/3 scheme. In a V/3 biasing scheme, the required write voltage $V_{write\_select}$ is applied to the selected word line, $V_{BL} < V_{write\_select}$ is applied to the unselected bit lines, $V_{WL} < V_{BL}$ to the unselected word lines, and the reference ground potential to the selected bit line. The choices of $V_{WL}$ and $V_{BL}$ minimizes overall leakage while preventing accidental disturbance to the half-selected and unselected devices in the ReRAM memory. The leakage due to the unselected devices (which are the vast majority) can be significantly reduced using the "V/2" biasing scheme in which $V_{BL}=V_{WL}$, at the expense of a higher stress on the half-selected devices, which experience half of the applied voltage.

An optimal write voltage can be defined as a write voltage that maximizes $P_W$ while minimizing $P_D$. The optimal voltage can be determined to be the voltage where $1-P_W=P_D$. For a regular write, i.e., a write without write-assist, an optimal write voltage of 2.1-2.2 V was found to result in $P_D=1-P_W \approx 10^{-7}$, which can be high for memory applications. However, by using the mT of the H3 cell in a write-assist mode as shown in part (d) of FIG. 10, the optimal voltage is reduced to 1.9 V with $P_D=1-P_W\approx10^{-13}$, which is several orders of magnitude lower than a regular write, and closer to the $10^{-15}$-$10^{-16}$ range that is typical for memory applications. In part (d) of FIG. 10, solid markers were computed through a Monte Carlo simulation, and the dashed lines were extrapolated fit functions.

In an embodiment, programming or writing an H3 cell can be accomplished by fixing a set write pulse width.

In an embodiment, due to large variations on write times of ReRAM devices, writing an H3 cell can be accomplished with a form of write-and-verify algorithm. A write-and-verify algorithm includes, e.g., applying a write pulse, reading the ReRAM device to check whether the device is programmed, and if the device is not programmed, reapplying the write pulse.

In an embodiment, assuming that an mT of the H3 cell is not being used during the write operation (i.e., during a regular write), monitoring the voltage at the middle electrode (e.g., at the end of the sense lines in FIG. 3 via the mT) should provide a real-time indication of whether the write operation is completed. That is, regardless of whether a logic '1' (in which a voltage V/2 is applied on the bit line and –V/2 on the word line) is being written or logic '0' (in which a voltage –V/2 is applied on the bit line and V/2 on the word line) is being written, the voltage at the middle electrode will initially be close to V/2, and then it will change polarity and get close to –V/2 when the write operation finishes, where V is at least greater than the max($|V_{th+}|$, $|V_{th-}|$). A good indication that the write operation is finished is that the voltage at the middle electrode (sensed at the end of the sense line) crosses 0 volts.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A resistive random-access memory (ReRAM) comprising a hybrid memory cell, wherein the hybrid memory cell comprises:
   a left resistance-switching device comprising a first terminal and a second terminal,
   a right resistance-switching device comprising a first terminal and a second terminal, wherein the first terminal of the right resistance-switching device is connected to the first terminal of the left resistance-switching device at an internal node, wherein the second terminal of the left resistance-switching device is directly connected to a word line and the second terminal of the right resistance-switching device is directly connected to a bit line; and
   a transistor comprising a source terminal, a drain terminal, and a gate terminal, wherein the drain terminal of the transistor is connected to the left resistance-switching device and the right resistance-switching device at the internal node.

2. The ReRAM according to claim 1, wherein the left resistance-switching device and the right resistance-switching device are memristors.

3. The ReRAM according to claim 1, wherein the left resistance-switching device and the right resistance-switching device are in opposite resistance states, wherein resistance states include a high resistance state and a low resistance state.

4. The ReRAM according to claim 1, wherein the transistor is a minimum sized transistor.

5. The ReRAM according to claim 1, wherein a logic level of the hybrid memory cell is based on a ratio of resistances of the right resistance-switching device and the left resistance-switching device.

6. The ReRAM according to claim 1, further comprising:
   peripheral circuitry coupled to the hybrid memory cell, the peripheral circuitry configured to program and/or determine a logic level of the hybrid memory cell.

7. The ReRAM according to claim 6, wherein the peripheral circuitry is configured to determine the logic level by:
   applying a read voltage between the second terminal of the left resistance-switching device and the second terminal of the right resistance-switching device;
   applying a voltage bias at the gate terminal of the transistor; and
   sensing voltage at the internal node via the source of the transistor.

8. The ReRAM according to claim 6, wherein the peripheral circuitry is configured to program the logic level by:
   applying a write voltage between the second terminal of the left resistance-switching device and the second terminal of the right resistance-switching device.

9. The ReRAM according to claim 6, wherein the peripheral circuitry is configured to program the logic level by:
applying a write voltage between the second terminal of the left resistance-switching device and the second terminal of the right resistance-switching device; and
applying a voltage bias at the gate of the transistor.

10. The ReRAM according to claim 6, wherein the peripheral circuitry comprises:
a word line driver coupled to the second terminal of the left resistance-switching device via the word line;
an enable line driver coupled to the gate terminal of the transistor;
a bit line driver coupled to the second terminal of the right resistance-switching device via the bit line; and
a sense line driver coupled to the source terminal of the transistor.

11. The ReRAM according to claim 10, wherein:
the word line driver is configured to provide a first bias to the hybrid memory cell;
the enable line driver is configured to select the hybrid memory cell to program and/or determine the logic level; and
the bit line driver is configured to provide a second bias to the hybrid memory cell.

12. The ReRAM according to claim 1, wherein the transistor is a p-type transistor or an n-type transistor.

13. A method for programming a hybrid memory cell of a resistive random-access memory (ReRAM), the method comprising:
applying a write voltage between a second terminal of a left resistance-switching device and a second terminal of a right resistance-switching device, wherein a first terminal of the left resistance-switching device is connected to a first terminal of the right resistance-switching device at an internal node; and
removing the write voltage after a predetermined time;
wherein the hybrid memory cell comprises the left resistance-switching device, the right resistance-switching device, and a transistor,
wherein the second terminal of the left resistance-switching device is directly connected to a word line and the second terminal of the right resistance-switching device is directly connected to a bit line.

14. The method according to claim 13, further comprising:
applying a first voltage bias at a gate of the transistor, wherein a drain of the transistor is connected to the internal node; and
removing the first voltage bias after a second predetermined time.

15. The method according to claim 13, further comprising:
monitoring the internal node to determine an internal node voltage by applying a first voltage bias at a gate of the transistor; and
determining that the predetermined time is a time that the internal node voltage crosses half of the write voltage.

16. A method for determining a logic level of a hybrid memory cell of a resistive random-access memory (ReRAM), the method comprising:
applying a read voltage between a second terminal of a left resistance-switching device and a second terminal of a right resistance-switching device, wherein a first terminal of the left resistance-switching device is connected to a first terminal of the right resistance-switching device at an internal node;
applying a voltage bias at a gate of a transistor, wherein a drain of the transistor is connected to the internal node; and
sensing voltage at the internal node via a source of the transistor;
wherein the hybrid memory cell comprises the left resistance-switching device, the right resistance-switching device, and the transistor.

17. The method according to claim 16, further comprising:
comparing the sensed voltage to a threshold voltage;
determining that the logic level of the hybrid memory cell is logic '1' when the sensed voltage is greater than the threshold voltage; and
determining that the logic level of the hybrid memory cell is logic '0' when the sensed voltage is less than the threshold voltage.

18. The method according to claim 17, wherein the threshold voltage is the read voltage divided by 2.

19. The method according to claim 16, wherein the logic level of the hybrid memory cell is based on a ratio of resistances of the right resistance-switching device and the left resistance-switching device.

20. The method according to claim 16, wherein the transistor is a minimum sized transistor.

* * * * *